(12) United States Patent
Nishi et al.

(10) Patent No.: US 7,535,440 B2
(45) Date of Patent: May 19, 2009

(54) LIGHT EMITTING DEVICE

(75) Inventors: Takeshi Nishi, Kanagawa (JP); Noriko Shibata, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 191 days.

(21) Appl. No.: 10/406,598

(22) Filed: Apr. 4, 2003

(65) Prior Publication Data

US 2003/0218173 A1 Nov. 27, 2003

(30) Foreign Application Priority Data

Apr. 9, 2002 (JP) ............................. 2002-106787

(51) Int. Cl.
*G09G 3/30* (2006.01)
(52) U.S. Cl. ............................. 345/76; 345/79; 345/82
(58) Field of Classification Search ............. 345/76–79, 345/82–83; 315/169.3; 313/506, 504
See application file for complete search history.

(56) References Cited

U.S. PATENT DOCUMENTS

| | | | |
|---|---|---|---|
| 4,871,236 A | 10/1989 | Gemma et al. | |
| 4,971,919 A | 11/1990 | Yamazaki | |
| 5,478,777 A | 12/1995 | Yamazaki | |
| 5,540,999 A * | 7/1996 | Yamamoto et al. | 428/411.1 |
| 5,552,678 A | 9/1996 | Tang et al. | |
| 5,663,573 A * | 9/1997 | Epstein et al. | 313/506 |

(Continued)

FOREIGN PATENT DOCUMENTS

EP 0 215 683 3/1987

(Continued)

OTHER PUBLICATIONS

Hiramoto et al., "Effect of Thin Gold Interstitial-Layer on the Photovoltaic Properties of Tandem Organic Solar Cell," The Chemical Society of Japan, Chemistry Letters, pp. 327-330, 1990.

(Continued)

*Primary Examiner*—Regina Liang
(74) *Attorney, Agent, or Firm*—Eric J. Robinson; Robinson Intellectual Property Law Office, P.C.

(57) ABSTRACT

A light emitting element, in which voltages having different polarities are applied alternately in order to prevent the accumulation of electric charge in an organic compound layer of the light emitting element, and in which light is always emitted, no matter whether a positive polarity voltage or a negative polarity voltage is applied, is provided. An opposing electrode is formed between a first electrode and a second electrode, and a first light emitting element having a compound layer that contains a first organic substance between the first electrode and the opposing electrode, and a second light emitting element having a compound layer that contains a second organic substance between the opposing electrode and the second electrode, are formed in the present invention. Note that a constant voltage (reference voltage) is imparted to the opposing electrode, and that voltages having inverse polarities are applied simultaneously, and alternately for fixed periods of time, to the first electrode and the second electrode. A light emitting element that always emits light, even if the polarity of the applied voltage changes, can thus be formed.

25 Claims, 10 Drawing Sheets

U.S. PATENT DOCUMENTS

| | | | |
|---|---|---|---|
| 5,677,546 A | 10/1997 | Yu | |
| 5,682,043 A | 10/1997 | Pei et al. | |
| 5,757,139 A * | 5/1998 | Forrest et al. | 315/169.3 |
| 5,837,391 A | 11/1998 | Utsugi | |
| 5,917,280 A * | 6/1999 | Burrows et al. | 313/506 |
| 5,970,318 A | 10/1999 | Choi et al. | |
| 5,982,345 A | 11/1999 | Takayama et al. | |
| 6,013,384 A | 1/2000 | Kido et al. | |
| 6,107,734 A | 8/2000 | Tanaka et al. | |
| 6,198,091 B1 | 3/2001 | Forrest et al. | |
| 6,198,092 B1 | 3/2001 | Bulovic et al. | |
| 6,278,055 B1 | 8/2001 | Forrest et al. | |
| 6,284,394 B1 * | 9/2001 | Arai et al. | 428/690 |
| 6,297,495 B1 | 10/2001 | Bulovic et al. | |
| 6,300,612 B1 | 10/2001 | Yu | |
| 6,320,322 B1 | 11/2001 | Tanaka | |
| 6,352,777 B1 | 3/2002 | Bulovic et al. | |
| 6,366,017 B1 * | 4/2002 | Antoniadis et al. | 313/506 |
| 6,423,429 B2 | 7/2002 | Kido et al. | |
| 6,451,415 B1 | 9/2002 | Forrest et al. | |
| 6,452,092 B2 | 9/2002 | Han et al. | |
| 6,489,638 B2 | 12/2002 | Seo et al. | |
| 6,503,644 B2 * | 1/2003 | Schoo et al. | 428/690 |
| 6,524,884 B1 | 2/2003 | Kim et al. | |
| 6,580,213 B2 | 6/2003 | Yamazaki | |
| 6,692,820 B2 | 2/2004 | Forrest et al. | |
| 6,844,025 B2 | 1/2005 | Forrest et al. | |
| 6,876,007 B2 | 4/2005 | Yamazaki et al. | |
| 2001/0007447 A1 * | 7/2001 | Tanaka et al. | 345/87 |
| 2001/0031509 A1 | 10/2001 | Yamazaki | |
| 2001/0046611 A1 | 11/2001 | Kido et al. | |
| 2002/0028347 A1 | 3/2002 | Marrocco, III et al. | |
| 2002/0081456 A1 * | 6/2002 | Hamada | 428/690 |
| 2002/0119297 A1 | 8/2002 | Forrest et al. | |
| 2002/0189666 A1 | 12/2002 | Forrest et al. | |
| 2002/0197462 A1 | 12/2002 | Forrest et al. | |
| 2003/0015805 A1 * | 1/2003 | Wakimoto et al. | 257/794 |
| 2003/0042846 A1 | 3/2003 | Forrest et al. | |
| 2003/0094612 A1 | 5/2003 | Yamazaki et al. | |
| 2003/0127967 A1 | 7/2003 | Tsutsui et al. | |
| 2003/0209974 A1 | 11/2003 | Yamazaki | |
| 2003/0218166 A1 | 11/2003 | Tsutsui | |
| 2004/0027059 A1 | 2/2004 | Tsutsui | |
| 2004/0027061 A1 | 2/2004 | Seo et al. | |
| 2004/0113546 A1 | 6/2004 | Forrest et al. | |
| 2004/0150333 A1 | 8/2004 | Tsutsui | |
| 2004/0151887 A1 | 8/2004 | Forrest et al. | |

FOREIGN PATENT DOCUMENTS

| | | |
|---|---|---|
| EP | 0 855 848 | 7/1998 |
| EP | 0 948 063 | 10/1999 |
| EP | 1 094 436 A2 | 4/2001 |
| JP | 55-029178 | 3/1980 |
| JP | 04-192376 | 7/1992 |
| JP | 06-318725 | 11/1994 |
| JP | 09-199276 | 7/1997 |
| JP | 09-218664 | 8/1997 |
| JP | 10-172760 | 6/1998 |
| JP | 10-270171 | 10/1998 |
| JP | 11-008064 | 1/1999 |
| JP | 11-251067 | 9/1999 |
| JP | 11-312584 | 11/1999 |
| JP | 11-329748 | 11/1999 |
| JP | 2000-195664 | 7/2000 |
| JP | 2000-260572 | 9/2000 |
| JP | 2001-056650 | 2/2001 |
| JP | 2001-203077 | 7/2001 |
| JP | 2001-222255 | 8/2001 |
| JP | 2001-291592 | 10/2001 |
| JP | 2001-357975 | 12/2001 |
| JP | 2002-083684 | 3/2002 |
| JP | 2002-164170 | 6/2002 |
| JP | 2003-045676 | 2/2003 |
| JP | 2003-515933 | 5/2003 |
| WO | WO 02/101838 | 12/2002 |

OTHER PUBLICATIONS

C.W. Tang et al., *Organic Electroluminescent Diodes*, Appl. Phys. Lett., vol. 51, No. 12, Sep. 21, 1987, pp. 913-915.

C.W. Tang, *Two-Layer Organic Photovoltaic Cell*, Appl. Phys. Lett., vol. 48, No. 2, Jan. 13, 1986, pp. 183-185.

H. Fuchigami et al., *Polythienylenevinylene Thin-Film Transistor With High Carrier Mobility*, Appl. Phys. Lett., vol. 63, No. 10, Sep. 6, 1993, pp. 1372-1374.

G. Parthasarathy et al., *A Metal-Free Cathode for Organic Semiconductor Devices*, Applied Physics Letters, vol. 72, No. 17, Apr. 27, 1998, pp. 2138-2140.

K.S. Narayan et al., *Light Responsive Polymer Field-Effect Transistor*, Applied Physics Letters, vol. 79, No. 12, Sep. 17, 2001, pp. 1891-1893.

D.J. Gundlach et al., *Pentacene Organic Thin-Film Transistors—Molecular Ordering and Mobility*, IEEE Electron Device Letters, vol. 18, No. 3, Mar. 1, 1977, pp. 87-89.

J. Kido et al., *High Quantum Efficiency Organic EL Devices Having Charge Generation Layer*, 49th Japan Society of Applied Physics and Related Societies, Mar. 1, 2002, 27P-YL-3, p. 1308.

B. Ruhstaller et al., *Bias-Tuned Reduction of Self-Absorption in Polymer Blend Electroluminescence*, Chemical Physics Letters, vol. 317, Feb. 4, 2000,pp. 238-244.

J. Ferraris et al., *Electron Transfer in a New Highly Conducting Donor-Acceptor Complex*, Journal of the American Chemical Society, vol. 95:3, Feb. 7, 1973, pp. 948-949.

G. Yu et al., *Charge Separation and Photovoltaic Conversion in Polymer Composites with Internal Donor/Acceptor Heterojunctions*, J. Appl. Phys., vol. 78, No. 7, Oct. 1, 1995, pp. 4510-4515.

H. Shirakawa et al., *Synthesis of Electrically Conducting Organic Polymers: Halogen Derivatives of Polyacetylene, $(CH)_x$*, J.C.S., Chem. Comm., No. 16, pp. 578-580, Jan. 1, 1977.

T. Tsutsui, *Mechanism of Organic EL Element and Luminous Efficiency*, Textbook of the 3rd Seminar at Division of Organic Molecular Electronics and Bioelectronics, The Japan Society of Applied Physics, Jan. 1, 1993, pp. 31-37.

Y. Sato, *Problem for Implementation in View of Materials Development*, The Japan Society of Applied Physics/Organic Molecular Electronics and Bioelectronics, vol. 11, No. 1, 2000, pp. 86-99.

\* cited by examiner

LIGHT EMITTING DEVICE

BACKGROUND OF THE INVENTION

1. Field of the Invention

The present invention relates to a light emitting element capable of being driven by alternating current drive, and to a light emitting device containing the light emitting element as a portion of the light emitting device.

2. Description of the Related Art

A light emitting element is made from an anode, a cathode, and an organic compound layer sandwiched by the anode and the cathode. Light emission develops by carriers injected from both electrodes (electrons and holes) recombining within the organic compound layer and generating electrical excitation states.

However, electric charge accumulates in the organic compound layer in this type of light emitting element when using direct current drive, in which a fixed direction bias is always applied, and therefore there arises a problem in that the light emission lifetime and brightness are reduced.

Reports of using alternating current drive, in which a driver voltage applied to the light emitting element during light emission and a reverse bias that has an inverse polarity with respect to the driver voltage are applied alternately, are made as disclosed, for example, in JP 10-172760 A, JP 11-8064 A, and the like.

This is because the electric charge that accumulates in an inner portion of the organic compound layer is relieved by alternately applying voltages having different polarities to the organic compound layer by alternating current drive, and therefore reductions in the light emission lifetime and brightness can be suppressed.

However, in the case of light emitting elements in accordance with alternating current drive, the light emitting element normally has a laminate structure composed of an anode, an organic compound layer, and a cathode, and therefore light emission can be obtained only when a positive voltage is applied from the anode side and a negative voltage is applied to the cathode side, namely when a forward bias is applied. That is, the light emitting element does not emit light when a reverse bias is applied using alternating current drive.

Thus, when an effective light emitting time is reduced, display becomes dark. Therefore, when a high voltage is applied in order to maintain a predetermined brightness, there arises a problem in that degradation of the light emitting elements proceeds.

SUMMARY OF THE INVENTION

An object of the present invention is therefore to provide a light emitting element in which voltages having different polarities are alternately applied to an organic compound layer of the light emitting element in order to prevent the accumulation of electric charge, and in which light emission can always be obtained, whether a positive or a negative polarity voltage is applied.

In order to solve the aforementioned objective, an opposing electrode is formed between a first electrode and a second electrode in the present invention, and a first light emitting element is formed by forming a compound layer that contains a first organic substance between the first electrode and the opposing electrode. In addition, a second light emitting element is formed by forming a compound layer that contains a second organic substance between the opposing electrode and the second electrode.

Note that a fixed voltage (reference voltage) is always imparted to the opposing electrode formed here, and a voltage that has positive polarity with respect to the reference voltage and a voltage that has negative polarity with respect to the reference voltage are applied alternately to the first electrode. Further, a voltage that has positive polarity with respect to the reference voltage and a voltage that has negative polarity with respect to the reference voltage are applied alternately to the second electrode. It is characterized in that the polarity of the voltage applied to the first electrode and the polarity of the voltage applied to the second electrode are inverse in the present invention. Further, the first light emitting element and the second light emitting element share the opposing electrode in the present invention.

Note that the first electrode and the second electrode are formed in the present invention by using materials suitable for forming electrodes having identical polarities. Specifically, in the case where the first electrode and the second electrode are formed so as to become anodes, an anodic material having a high work function (preferably a material having a work function equal to or greater than 4.5 eV) is used in their formation. Conversely, in the case where the electrodes are formed so as to become cathodes, a cathodic material having a small work function (the work function is preferably equal to or less than 3.8 eV) is used in their formation. Note that, if the first electrode and the second electrode are formed by using an anodic material, then the opposing electrode is formed by using the opposite, i.e., a cathodic material. Further, if the first electrode and the second electrode are formed by using a cathodic material, then the opposing electrode is formed by using the opposite, i.e., an anodic material.

Note that, in the case where the first electrode and the second electrode are formed by using an anodic material and the common electrode is formed by using a cathodic material, a forward bias is applied to the compound layer that contains the first organic substance and structures the first light emitting element when a positive polarity voltage with respect to the reference voltage is applied to the first electrode. The carrier therefore recombines in an inner portion of the first organic compound layer, and then light is emitted. Further, a negative voltage with respect to the reference voltage is applied to the second electrode at this point as explained above, and a reverse bias is applied to the compound layer that contains the second organic substance and structures the second light emitting element. Then, the second light emitting element does not emit light. Note that, as a matter of convenience, light emission by the compound layer containing the first organic substance is expressed as the first light emitting element emitting light, and light emission by the compound layer that contains the second organic substance is expressed as the second light emitting element emitting light.

On the other hand, when a voltage having a negative polarity with respect to the reference voltage is applied to the first electrode, the compound layer that contains the first organic substance and structures the first light emitting element does not emit light because a reverse bias is applied to the first light emitting element. Further, a positive voltage with respect to the reference voltage is applied to the second electrode at this point, and a forward bias is applied to the compound layer that contains the second organic substance and structures the second light emitting element. Then, the second light emitting element emits light. Note that the accumulation of electric charge that develops within the compound layer containing the first organic substance when the forward bias is applied above can be relieved by applying the reverse bias here to the compound layer that contains the first organic substance.

The first light emitting element and the second light emitting element thus emit light alternately, and during a period when one light emitting element is emitting light, the other light emitting element does not emit light and accumulated electric charge can thus be relieved. Reductions in the light emission lifetime and degradation in brightness can therefore be suppressed. In addition, it becomes possible to perform display without shortening the effective light emission time because, even if voltages having different polarities are applied alternately, the light emitting element of the present invention is provided with light emitting elements showing light emission no matter what polarity voltage is applied. Thus, it is possible to solve problems in that the display becomes dark, and problems in that deterioration of the organic compound layers develops due to a high voltage being applied in order to maintain a predetermined brightness.

According to a structure of the present invention, there is provided a light emitting device including:
- a chemical compound layer containing a first electrode and a first organic substance;
- an opposing electrode;
- a chemical compound layer containing a second organic substance; and
- a second electrode;

in which:
- the chemical compound layer containing the first organic compound is disposed between the first electrode and the opposing electrode;
- the chemical compound layer containing the second organic substance is disposed between the opposing electrode and the second electrode;
- a fixed voltage is applied to the opposing electrode; and
- by applying a voltage having one of the positive polarity and the negative polarity to the first electrode, taking the voltage applied to the opposing electrode as a reference, and simultaneously applying a voltage, to the second electrode, which is inverse in polarity to the voltage applied to the first electrode:
  - one of the chemical compound layer containing the first organic substance or the chemical compound layer containing the second organic substance emits light.

According to a structure of the present invention, there is provided a light emitting device including:
- a chemical compound layer containing a first electrode and a first organic substance;
- an opposing electrode;
- a chemical compound layer containing a second organic substance; and
- a second electrode;

in which:
- the chemical compound layer containing the first organic substance is disposed between the first electrode and the opposing electrode;
- the chemical compound layer containing the second organic substance is disposed between the opposing electrode and the second electrode;
- a fixed voltage is applied to the opposing electrode; and
- by applying a voltage having one of the positive polarity and the negative polarity alternately for fixed periods to the first electrode, taking the voltage applied to the opposing electrode as a reference, and simultaneously applying a voltage, alternately for fixed periods, to the second electrode, which is inverse in polarity to the voltage applied to the first electrode:
  - one of the chemical compound layer containing the first organic substance and the chemical compound layer containing the second organic substance emits light alternately for fixed periods.

According to a structure of the present invention, there is provided a light emitting device including:
- a chemical compound layer containing a first electrode and a first organic substance;
- an opposing electrode;
- a chemical compound layer containing a second organic substance; and
- a second electrode;

in which:
- the chemical compound layer containing the first organic substance is disposed between the first electrode and the opposing electrode;
- the chemical compound layer containing the second organic substance is disposed between the opposing electrode and the second electrode;
- a fixed voltage is applied to the opposing electrode; and
- by applying voltages having one of the positive polarity and the negative polarity alternately to the first electrode for fixed periods, taking the voltage applied to the opposing electrode as a reference, and by simultaneously applying voltages, which are inverse in polarity to the voltages applied to the first electrode, alternately to the second electrode for fixed periods:
  - a forward bias is applied to one of the chemical compound layer containing the first organic substance or the chemical compound layer containing the second organic substance;
  - simultaneously a reverse bias is applied to the other chemical compound layer; and
  - the polarities of the biases applied to the chemical compound layer containing the first organic substance and the chemical compound layer containing the second organic substance are changed alternately for fixed periods.

In a structure of the present invention, there is provided a light emitting device including:
- a chemical compound layer containing a first electrode and a first organic substance;
- an opposing electrode;
- a chemical compound layer containing a second organic substance; and
- a second electrode;

wherein:
- the chemical compound layer containing the first organic substance is disposed between the first electrode and the opposing electrode;
- the chemical compound layer containing the second organic substance is disposed between the opposing electrode and the second electrode;
- the first electrode and the second electrode are formed by an anodic material;
- the opposing electrode is formed by a cathodic material;
- a fixed voltage is applied to the opposing electrode; and
- by applying a voltage having a positive polarity to the first electrode, taking the voltage applied to the opposing electrode as a reference, and simultaneously applying a voltage having a negative polarity to the second electrode, taking the voltage applied to the opposing electrode as a reference:
  - the chemical compound layer containing the first organic substance emits light; and
  - electric charge that accumulates in the chemical compound layer containing the second organic substance is simultaneously relieved.

In a structure of the present invention, there is provided a light emitting device including:
- a chemical compound layer containing a first electrode and a first organic substance;
- an opposing electrode;
- a chemical compound layer containing a second organic substance; and
- a second electrode;

in which:
- the chemical compound layer containing the first organic substance is disposed between the first electrode and the opposing electrode;
- the chemical compound layer containing the second organic substance is disposed between the opposing electrode and the second electrode;
- the first electrode and the second electrode are formed by an anodic material;
- the opposing electrode is formed by a cathodic material;
- a fixed voltage is applied to the opposing electrode;
- voltages having one of the positive polarity and the negative polarity are applied alternately to the first electrode for fixed periods, taking the voltage applied to the opposing electrode as a reference, and voltages, which are inverse in polarity to the voltages applied to the first electrode, are simultaneously applied alternately to the second electrode for fixed periods;
- the chemical compound layer containing the first organic substance emits light by the positive polarity voltages being applied to the first electrode; and
- the chemical compound layer containing the second organic substance emits light by the positive polarity voltages being applied to the second electrode.

According to a structure of the present invention, there is provided a light emitting device including:
- a chemical compound layer containing a first electrode and a first organic substance;
- an opposing electrode;
- a chemical compound layer containing a second organic substance; and
- a second electrode;

in which:
- the chemical compound layer containing the first organic substance is disposed between the first electrode and the opposing electrode;
- the chemical compound layer containing the second organic substance is disposed between the opposing electrode and the second electrode;
- the first electrode and the second electrode are formed by an anodic material;
- the opposing electrode is formed by a cathodic material;
- a fixed voltage is applied to the opposing electrode;
- voltages having one of the positive polarity and the negative polarity are applied alternately to the first electrode for fixed periods, taking the voltage applied to the opposing electrode as a reference, and voltages, which are inverse in polarity to the voltages applied to the first electrode, are simultaneously applied alternately to the second electrode for fixed periods;
- the chemical compound layer containing the first organic substance emits light by the positive polarity voltages being applied to the first electrode; and
- electric charge that accumulates in the chemical compound layer containing the second organic substance is simultaneously relieved.

The opposing electrode in each of the aforementioned structures is formed by using a light transmitting conductive material. Note that, in the case where light generated by the compound layer containing the organic substance and is emitted from only any one of the first electrode and the second electrode of the present invention, the electrode on the side to which the light is emitted is formed by using a light transmitting material, and the electrode on the side that shields light is formed by using a light blocking material. Note that light generated in the compound layer that contains the organic substance can be efficiently emitted by using a material having, specifically, a transmittivity which is equal to or greater than 40% with respect to visible light as the light transmitting material. Further, the light generated in the compound layer that contains the organic substance can be sufficiently blocked by using a material having, specifically, a transmittivity in visible light which is less than 10% as the light blocking material.

DETAILED DESCRIPTION OF THE PREFERRED EMBODIMENTS

Embodiment Mode

Figure 1A:
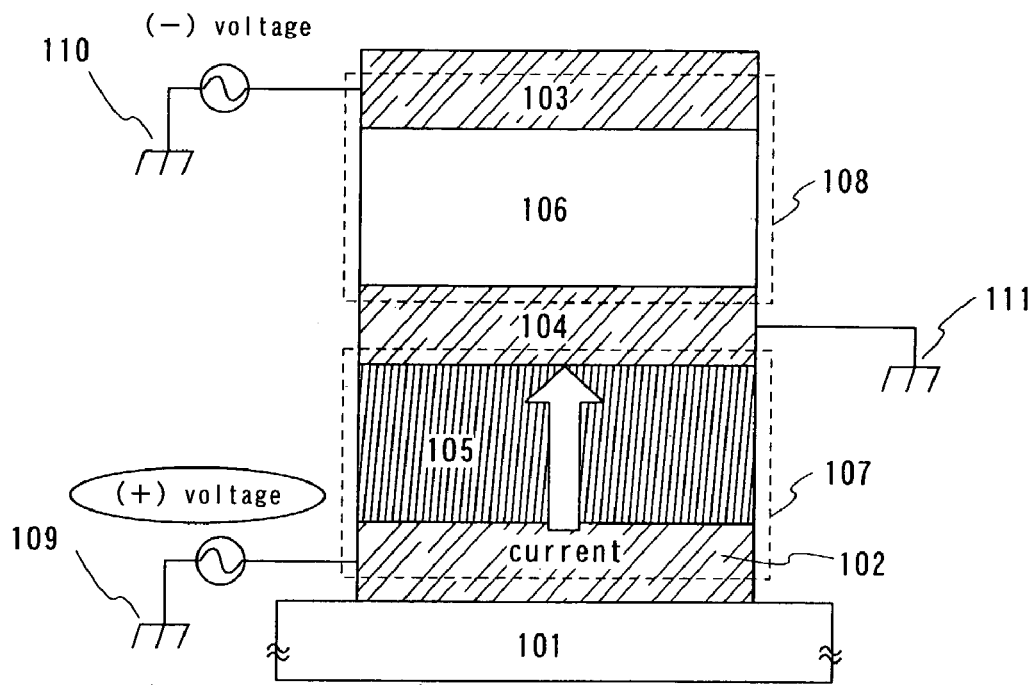
FIGS. 1A and 1B are diagrams for explaining an element structure of a light emitting element of the present invention.
Figure 1B:
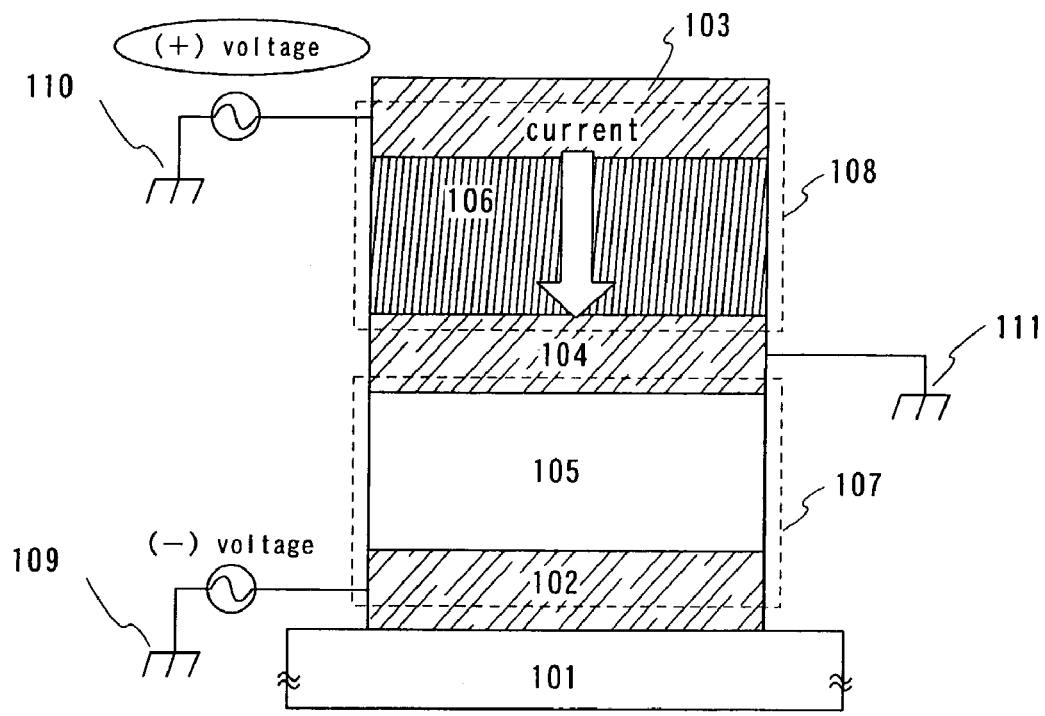

An embodiment mode of the present invention is explained using FIGS. 1A and 1B. Note that FIGS. 1A and 1B are diagrams that show an element structure of a light emitting element in the present invention.

Figure 2:
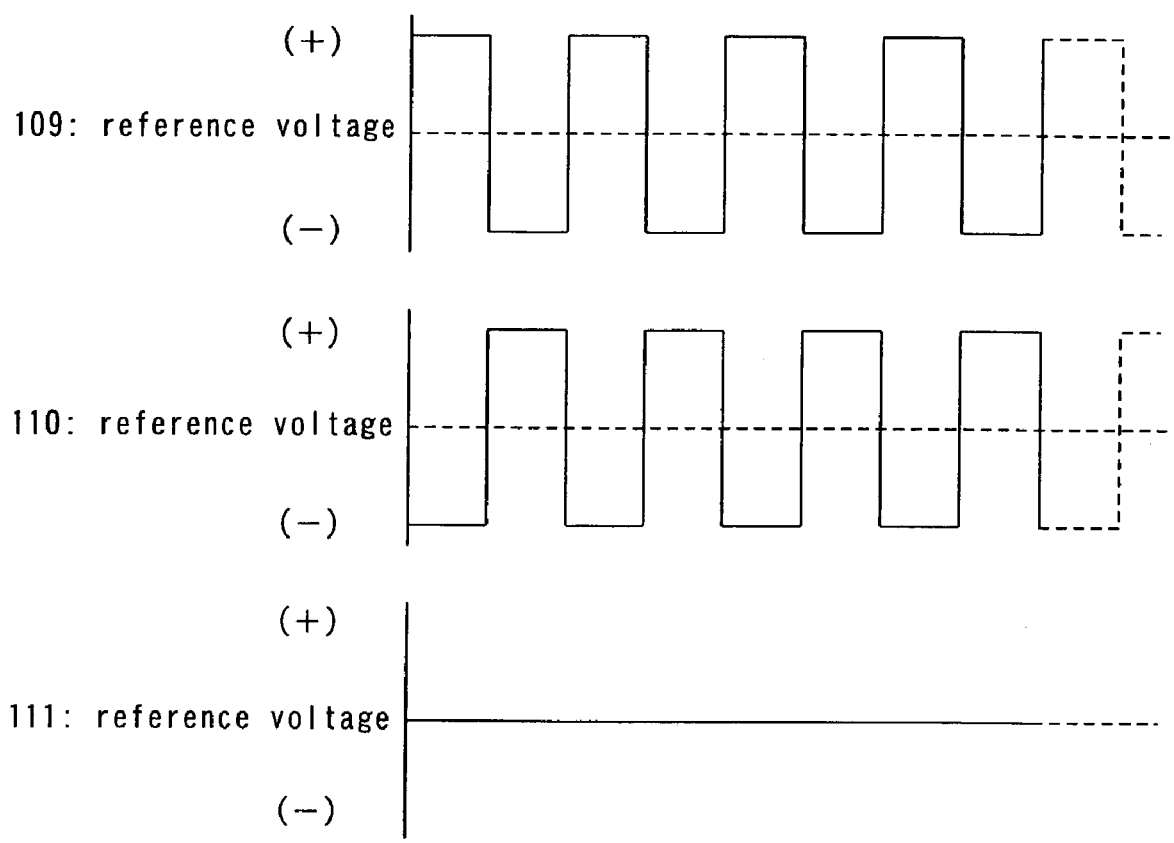
FIG. 2 is a diagram for explaining a voltage applied to the light emitting element of the present invention.

A first electrode 102 is formed on a substrate 101 in FIGS. 1A and 1B. Note that the first electrode 102 is electrically connected to a first electric power source 109, which is an alternating current power source, and voltages having either positive or negative polarity with respect to a reference voltage are applied alternately from the first electric power source 109, as shown in FIG. 2. Further, the first electrode 102 is formed by using a material having a large work function that is capable of forming an anode (anodic material) in the embodiment mode of the present invention. Note that it is preferable the formation be performed by using a material having a work function which is equal to or greater than 4.5 eV as the anodic material. Specifically, an indium tin oxide (ITO), which is known as a light transmitting conductive film, indium zinc oxide (IZO) in which 2 to 20% of zinc oxide (ZnO) is mixed into indium oxide, and in addition, element residing in groups 4 to 11 of the long-period type periodic table, such as gold (Au), platinum (Pt), nickel (Ni), tungsten (W), chromium (Cr), molybdenum (Mo), iron (Fe), cobalt (Co), copper (Cu), palladium (Pd) and the like, and chemical compounds of these elements can be used. Further, in the case where the first electrode 102 functions as an electrode for emitting light that is generated in a first organic compound layer 105 or a second organic compound layer 106 to the outside, the first electrode 102 is formed using a light transmitting material having a transmittivity to such an extent that can emit light from the first electrode 102 (specifically, the transmittivity of visible light is equal to or greater than 40%). Conversely, in the case where a structure that emits light only from a second electrode 103 side is formed, the first electrode 102 is formed using a light blocking material having a transmittivity to such an extent that can block the emission of light from the first electrode 102 (specifically, the transmittivity of visible light is less than 10%).

Next, the first organic compound layer 105 is formed on the first electrode 102. Note that low molecular weight organic compound materials and high molecular weight organic compound materials can be used as materials for forming the first organic compound layer 105. Further, the term organic compound material includes not only those materials made from only known organic compound materials, but also organic compound materials that contain inorganic compounds in a portion therein. Note that, although a compound layer that contains a first organic substance is denoted by the term first organic compound layer, and a compound layer that contains a second organic substance is denoted by the term second organic compound layer, as a matter of convenience in this embodiment mode and embodiments shown hereafter, they each denote the same things and may be formed by using the aforementioned materials.

Note that the organic compound layer 105 is formed by a laminate that uses a functional materials such as a hole transporting material, a light emitting material, an electron transporting material, a blocking material, and in addition, a hole injecting material and the like. Furthermore, the laminate structure of the organic compound layer may be combined freely in the present invention. Several examples of suitable materials are given below. However, the materials used in the present invention are not limited to these. In addition, the present invention is not limited to the examples of functional materials provided above, and other known functional materials can also be used.

Aromatic amine-based compounds (namely, those having benzene ring-nitrogen bonds) are suitable for the hole transporting material. Materials widely used include:, starburst type aromatic amine compounds such as 4,4'-bis[N-(1-naphthyl)-N-phenyl-amino]-biphenyl which is the derivative (hereinafter, referred to as α-NPD); 4,4',4''-tris(N,N-diphenyl-amino)-triphenylamine (hereinafter, referred to as TDATA); and 4,4',4''-tris[N-(3-methylphenyl)-N-phenylamino]-triphenylamine (hereinafter, referred to as MTDATA) in addition to the above-mentioned TPD thereof.

Specifically, effective as the light emitting material are various fluorescent pigments as well as metal complexes such as tris(8-quinolinolato)aluminum (hereinafter, referred to as $Alq_3$), tris(4-methyl-8-quinolinolato)aluminum (hereinafter, referred to as $Almq_3$), bis(10-hydroxybenzo[h]quinolinato) beryllium (hereinafter, referred to as $BeBq_2$), bis(2-methyl-8-quinolinolate)-(4-hydroxy-biphenylyl)aluminum (hereinafter, referred to as BAlq), bis[2-(2-hydroxyphenyl)-benzoxazolato]zinc (hereinafter, referred to as $Zn(BOX)_2$), and bis[2-(2-hydroxyphenyl)-benzothiazolato]zinc (hereinafter, referred to as $Zn(BTZ)_2$). In addition, triplet light emission materials may also be used, and metal complexes each containing platinum or iridium as a central metal can also be used. The triplet light emission materials include: tris(2-phenylpyridine)iridium (hereinafter, referred to as $Ir(ppy)_3$); 2,3,7,8,12,13,17,18-octaethyl-21H,23H-porphyrin-platinum (hereinafter, referred to as PtOEP); and the like.

Metal complexes having quinoline skeleton or benzoquinoline skeleton such as the above-mentioned $Alq_3$, $Almq_3$, and $BeBq_2$, BAlq serving as a mixed ligand complex, and the like are suitable for electron transporting materials. Metal complexes having oxazole-based ligands or thiazole-based ligands such as $Zn(BOX)_2$ and $Zn(BTZ)_2$ are also suitable. Furthermore, other than metal complexes, oxadiazole derivatives such as 2-(4-biphenylyl)-5-(4-tert-buthylphenyl)-1,3,4-oxadiazole (hereinafter, referred to as PBD) and 1,3-bis[5-(p-tert-butylphenyl)-1,3,4-oxadiazole-2-yl]benzene (hereinafter, referred to as OXD-7), triazole derivatives such as 3-(4-tert-butylphenyl)-4-phenyl-5-(4-biphenylyl)-1,2,4-triazole (hereinafter, referred to as TAZ) and 3-(4-tert-butylphenyl)-4-(4-ethylphenyl)-5-(4-biphenylyl)-1,2,4-triazole (hereinafter, referred to as p-EtTAZ), and phenanthroline derivatives such as bathophenanthroline (hereinafter, referred to as Bphen) and bathocuproine (hereinafter, referred to as BCP) can be used therefor.

Furthermore, within the framework of organic compounds, porphyrin-based compounds are effective for the hole injection material, so that a phthalocyanine (hereinafter, referred to as $H_2$-Pc), a copper phthalocyanine (hereinafter, referred to as CuPc), or the like can be used therefor. In addition, materials obtained by performing chemical doping on conductive polymeric compounds are also effective therefor, so that polyethylene dioxythiophene (hereinafter, referred to as PEDOT) doped with polystyrene sulfonate (hereinafter, referred to as PSS), polyaniline, polyvinylcarbazole (hereinafter, referred to as PVK), or the like can be used therefor.

Furthermore, the above-mentioned BAlq, OXD-7, TAZ, p-EtTAZ, Bphen, BCP, or the like can be used for the blocking material.

An opposing electrode 104 is formed next on the first organic compound layer 105. Note that the opposing electrode 104 is formed by using a material having a small work function and capable of forming a cathode (cathodic material), in the embodiment mode of the present invention. Note that it is preferable to use materials having a work function which is equal to or less than 3.8 eV as the cathodic material here for the formation. Elements residing in group 1 or group 2 of the element periodic law, that is, alkaline metals such as Li and Cs, and alkaline earth metals such as Mg, Ca and Sr, alloys and chemical compounds that contain these elements, and in addition, transition metals containing rare earth metals can be used in forming the opposing electrode. A laminate with a metal such as Al, Ag, or ITO (including alloys) may also be formed.

Further, the opposing electrode 104 forms a first light emitting element 107 using the first electrode 102 and the first organic compound layer 105, as explained above. Further, a third electric power source 111 is electrically connected to the opposing electrode 104, and a fixed voltage (reference voltage) is imparted from the third electric power source 111 to the opposing electrode 104 as shown in FIG. 2. In addition, the opposing electrode 104 also functions as one electrode that forms a second light emitting element 108 as explained below. The opposing electrode 104 is therefore formed by using a light transmitting conductive material so as to be able to transmit light whether the first light emitting element 107 or the second light emitting element 108 emits light.

A second organic compound layer 106 is formed next on the opposing electrode 104. Note that the second organic compound layer 106 can be formed by using the known organic compound materials shown when the first organic compound layer 105 is formed. It is preferable to form the second organic compound layer 106 by using the same material as that used for the first organic compound layer 105. Further, in the case where the first organic compound layer 105 and the second organic compound layer 106 have laminate structures composed of a plurality of organic compound materials, it is also preferable to form them so that their order of lamination with respect to the electrodes (anode or cathode), their film thicknesses, and the like are also the same.

The second electrode 103 is formed on the second organic compound layer 106. Note that the second electrode 103 is electrically connected to a second electric power source 110, which is an alternating current power source, and voltages having positive or negative polarity with respect to the reference voltage are alternately applied from the second electric power source 110 as shown in FIG. 2. Further, the voltage applied to the second electrode 103 here is a voltage having the inverse polarity and it is applied at the same timing as that of the voltage applied to the first electrode 102 explained above. Furthermore, in the embodiment mode of the present invention, the second electrode 103 is formed by using an anodic material having a large work function and capable of forming an anode. Note that the anodic materials shown as materials for forming the first electrode 102 can be used as the anodic material. Further, it is necessary to form the second electrode 103 by using a light transmitting anodic material in the case where the second electrode 103 functions as an electrode for emitting light that is generated in the first organic compound layer 105 or the second organic compound layer 106 to the outside. Furthermore, the second electrode 103 is formed by using a light blocking anodic material if a structure is formed in which light is emitted only from the first electrode 102 side.

FIG. 1A explains a case in which a positive polarity voltage is applied to the first electrode 102 and a negative polarity voltage is applied to the second electrode 103 in the light emitting element having the above structure. Note that, as explained above, the fixed reference voltage is applied to the opposing electrode 104. The application of a positive polarity voltage is shown as a higher voltage than the reference voltage being applied. The application of a negative polarity voltage is shown as a lower voltage than the reference voltage being applied.

The first electrode 102 and the second electrode 103 are formed by using anodic materials here, and therefore electric current flows within the first organic compound layer 105 only from the first electrode 102, to which a positive polarity voltage is applied. Carriers (electrons and holes) are injected within the first organic compound layer 105 by the electric current flowing within the first organic compound layer 105, and therefore light emission occurs within the first organic compound layer 105 due to carrier recombination. If a forward bias is thus applied to the light emitting element, and carrier recombination develops within an inner portion of the organic compound layer, then the light emitting element emits light.

Regardless of being formed by using an anodic material, a negative polarity voltage is applied to the second electrode 103 at this point. Electric current therefore does not flow within the second organic compound layer 106 from the second electrode 103, and then, the second organic compound layer 106 does not emit light. A negative polarity voltage is applied to the second electrode 103 here, and a reverse bias is therefore applied to the second organic compound layer 106. Accumulation of electric charge in an inner portion of the second organic compound layer 106 can thus be relieved by application of the reverse bias.

In contrast to this, FIG. 1B is shows a case in which voltages having polarities that are the inverse of those shown in FIG. 1A are applied to the first electrode 102 and the second electrode 103, respectively. That is, a negative polarity voltage, which is the inverse polarity with respect to the positive polarity of FIG. 1A, is applied to the first electrode 102, and a positive polarity voltage, which is the inverse polarity with respect to the negative polarity of FIG. 1A, is applied to the second electrode 103.

Electric current flows within the second organic compound layer 106 only from the second electrode 103 in this case. Carriers (electrons and holes) are injected within the second organic compound layer 106 by the electric current flowing within the second organic compound layer 106, and therefore light emission occurs within the second organic compound layer 106 due to carrier recombination.

Regardless of being formed by using an anodic material, a negative polarity voltage is applied to the first electrode 102 at this point. Electric current therefore does not flow within the first organic compound layer 105 from the first electrode 102, and then, the first organic compound layer 105 does not emit light. A negative polarity voltage is applied to the first electrode 102 here, and a reverse bias is therefore applied to the first organic compound layer 105. Accumulation of electric charge in an inner portion of the first organic compound layer 105, which shows light emission in FIG. 1A, can thus be relieved in FIG. 1B by application of the reverse bias.

Note that a case in which the first electrode 102 and the second electrode 103 are formed by using anodic materials, and the opposing electrode 104 is formed by using a cathodic material, is explained above. However, the present invention is not limited to such, and the first electrode 102 and the second electrode 103 can also be formed by using a cathodic material, and the opposing electrode 104 can be formed by using anodic materials.

EMBODIMENTS

Embodiments of the present invention are explained below.

Embodiment 1

A case of a structure in which a first electrode 302 and a second electrode 303 are formed by using anodic materials, an opposing electrode 304 is formed by using a cathodic material, and light that is generated in a first organic compound layer 305 and a second organic compound layer 306 is emitted from the first electrode 302 side (bottom emission type) is explained.

Figure 3A:
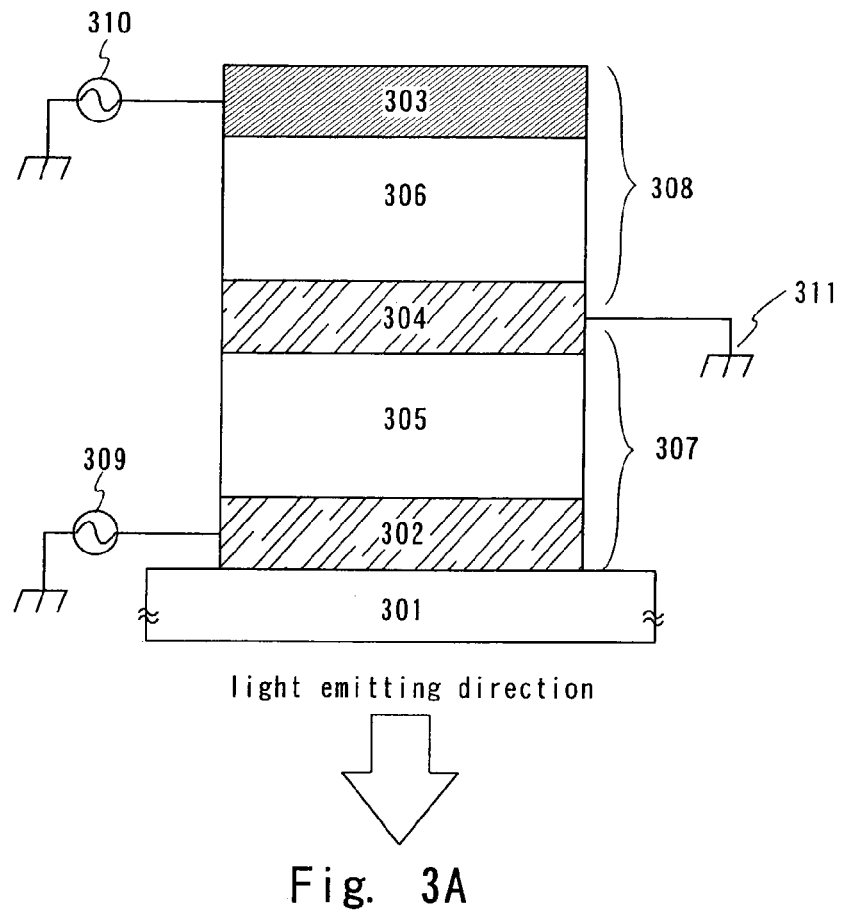
FIGS. 3A and 3B are diagrams for explaining a bottom emission type light emitting element.
Figure 3B:
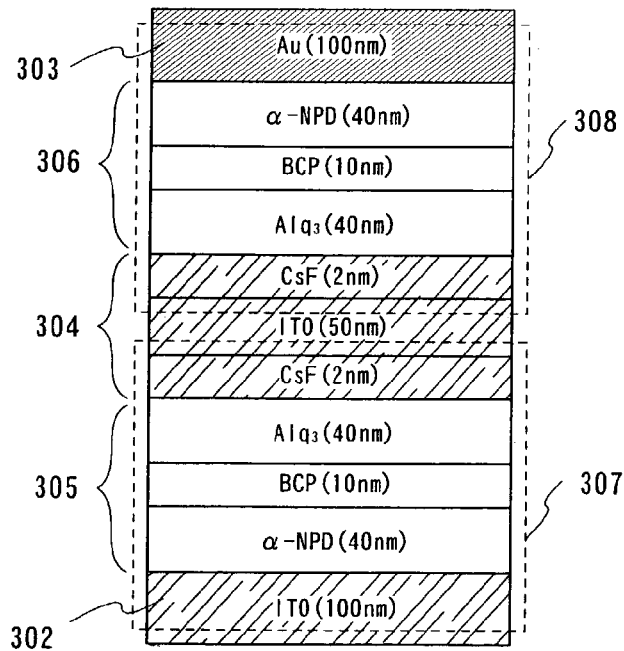

As shown in FIG. 3A, the first electrode 302 is electrically connected to a first electric power source 309, and the second electrode 303 is electrically connected to a second electric power source 310. In addition, the opposing electrode 304 is electrically connected to a third electric power source 311. Note that the third electric power source 311 is controlled so as to always apply a constant fixed voltage (reference voltage). Note also that, in this embodiment, the voltage applied from the third electric power source 311 is set to 0 V.

Further, the first electric power source 309 and the second electric power source 310 are set so that reverse polarity voltages like those shown in FIG. 2 are applied alternately to the electrodes (the first electrode 302 or the second electrode 303) which the electric power sources are connected to, respectively. In this embodiment, +5 V is applied as a positive polarity voltage, and −5 V is applied as a negative polarity voltage, to each of the electrodes.

That is, when the +5 V voltage is applied from the first electric power source 309 to the first electrode 302, the opposing electrode 304 is 0 V, and therefore a forward bias is applied to the first organic compound layer 305, and then, a first light emitting element 307 emits light.

The −5 V voltage is applied simultaneously to the second electrode 303 from the second electric power source 310 at this point, and the opposing electrode 304 is 0 V, and therefore a reverse bias is applied to the second organic compound layer 306, and then, a second light emitting element 308 does not emit light.

Conversely, when the −5 V voltage is applied from the first electric power source 309 to the first electrode 302, the opposing electrode 304 is 0 V, and therefore a reverse bias is applied to the first organic compound layer 305, and then, the first light emitting element 307 does not emit light.

The +5 V voltage is applied simultaneously to the second electrode 303 from the second electric power source 310 at this point, and the opposing electrode 304 is 0 V, and therefore a forward bias is applied to the second organic compound layer 306, and then, the second light emitting element 308 emits light.

The structure of the light emitting elements formed on a substrate 301 is explained in detail next in this embodiment.

First, the first electrode 302 that serves as an anode of the first light emitting element 307 is formed. Note that the first electrode 302 is an anode, and further, it is necessary to provide the first electrode 302 with function for transmitting light that is generated in the organic compound layer, and therefore, the first electrode 302 is formed by sputtering using ITO, which is a light transmitting conductive film, at a film thickness of 100 nm.

The first organic compound layer 305 is formed next. Note that a laminate is formed in this embodiment by evaporating 40 nm of the hole transporting material α-NMD, 10 nm of the blocking material BCP, and 40 nm of the electron transporting material $Alq_3$.

The opposing electrode 304 is formed next as a cathode. A laminate is formed in this embodiment from 2 nm of cesium fluoride (CsF) containing cesium (Cs), which has a small work function, 50 nm of ITO, which is a light transmitting conductive film, and in addition, 2 nm of CsF The opposing electrode 304 is formed in this embodiment by forming a laminate structure in which a material having a small work function is used in portions that are brought into contact with the organic compound layers, and a conductive material having superior light transmitting characteristics is sandwiched therebetween. The opposing electrode 304, which possesses a plurality of functions, can thus be formed.

Note that a cathodic material is used as the material for forming the opposing electrode 304. It is not always necessary to form a laminate structure like that explained above, however, and a single layer structure may also be formed, provided that a conductive material having light transmitting characteristics is employed.

Further, barium fluoride ($BaF_2$), calcium fluoride (CaF), and the like can also be used as a substitute for cesium fluoride (CsF) when manufacturing the cathode.

The second organic compound layer 306 is formed next. Note that the second organic compound layer 306 is formed by evaporation using the same material as that used for the first organic compound layer 305 in this embodiment. However, the lamination order from the opposing electrode 304 side is the exact opposite to that of the first organic compound layer 305, which is laminated on the first electrode 302, because the relationship with the electrode is different. That is, the second organic compound layer 306 is formed of a laminate obtained by evaporating 40 nm of the electron transporting material $Alq_3$, 10 nm of the blocking material BCP, and 40 nm of the hole transporting material α-NPD.

Lastly, the second electrode 303 is formed. The second electrode 303 is an anode of the second light emitting element 308, and further, it is necessary to provide the second electrode 303 with function for blocking or reflecting light that develops in the organic compound layers. The second electrode 303 is therefore formed by using the anodic material gold (Au) at a film thickness of 100 nm, thus giving it light blocking characteristics.

Note that the second electrode 303 is formed on the second organic compound layer 306 that is already formed, and therefore the second electrode 303 is formed by using evaporation in order to minimize damage to the organic compound layer as much as possible during film formation. Note also that, even if elements residing in groups 4 to 11 of the long-period type period table, such as platinum (Pt), nickel (Ni), tungsten (W), chromium (Cr), molybdenum (Mo), iron (First electrode), cobalt (Co), copper (Cu), palladium (Pd) and the like, or chemical compounds of these elements, can be used as the anodic material employed in the second electrode 303 in this embodiment as a substitute for gold (Au) to form the second electrode 303 at a film thickness that possesses light blocking characteristics.

Note that, in the present invention, the first light emitting element 307 and the second light emitting element 308 are each structured by sharing the opposing electrode 304, which is a cathode.

Light emitting elements capable of emitting light, which is generated in the organic compound layers (the first organic compound layer 305 and the second organic compound layer 306), with efficiency only from the first electrode 302 side can thus be formed in this embodiment. Further, in the case where inverse polarity voltages are applied alternately, the first light emitting element 307 or the second light emitting element 308 can be made to emit light alternately, and simultaneously, electric charge accumulation that develops in an inner portion of the organic compound layer during light emission can be relieved by applying the reveres bias in the light emitting element to which a reverse bias is applied, and which does not emit light.

Figure 4A:
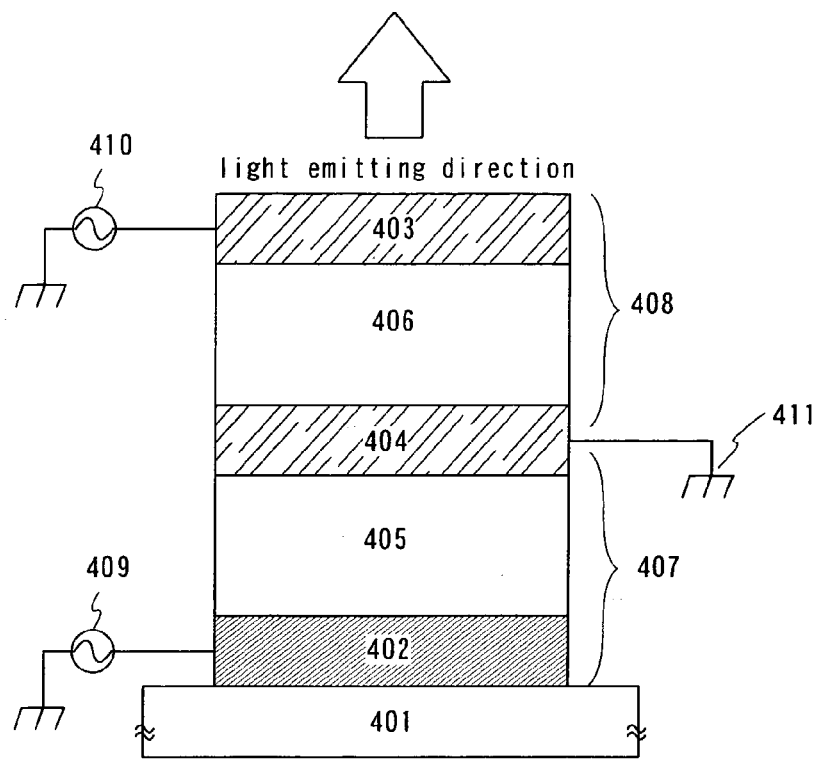
FIGS. 4A and 4B are diagrams for explaining a top emission type light emitting element.
Figure 4B:
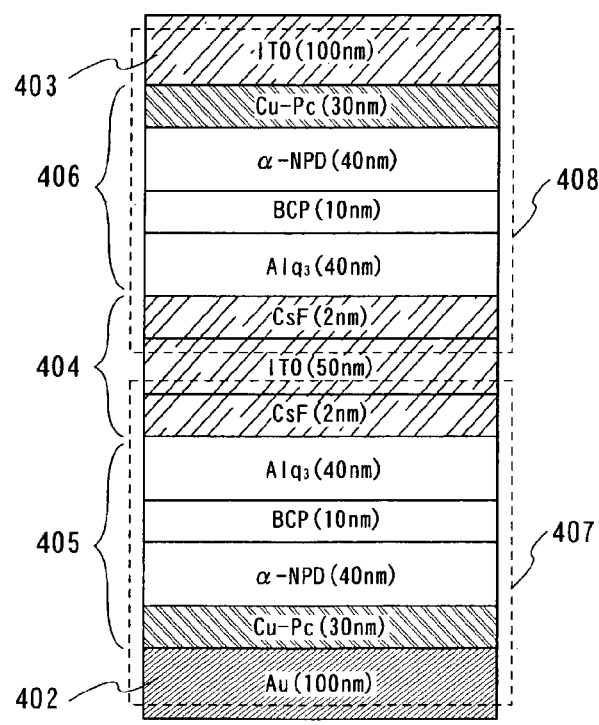

In this embodiment, differently from Embodiment 1, a case of a structure in which a second electrode 403 is formed by using light transmitting materials as shown in FIG. 4A, and light that is generated in a first organic compound layer 405 and a second organic compound layer 406 is emitted from the second electrode 403 side (top emission type) is explained.

As shown in FIG. 4A, the first electrode 402 is electrically connected to a first electric power source 409, and the second electrode 403 is electrically connected to a second electric power source 410. In addition, the opposing electrode 404 is electrically connected to a third electric power source 411. Note that the third electric power source 411 is controlled so as to always apply a constant fixed voltage (reference voltage). Note also that, in this embodiment, the voltage applied from the third electric power source 411 is set to 0 V.

Further, the first electric power source 409 and the second electric power source 410 are set so that reverse polarity voltages like those shown by FIG. 2 are applied alternately to the electrodes (the first electrode 402 or the second electrode 403) which the electric power sources are connected to, respectively. In this embodiment, +5 V is applied as a positive polarity voltage, and −5 V is applied as a negative polarity voltage, to each of the electrodes.

The structure of the light emitting elements formed on a substrate 401 is explained in detail next in this embodiment.

First, the first electrode 402 that serves as an anode of the first light emitting element 407 is formed. Note that the first electrode 402 is an anode of the first light emitting element 407, and further, in this embodiment, it is necessary to provide the first light emitting element 407 with function for blocking or reflecting light that is generated in the organic compound layer, and therefore, the first electrode 402 is formed by using gold (Au), which is an anodic material, at a film thickness of 100 nm.

Note that the first electrode 402 is formed by using evaporation. Note also that elements residing in groups 4 to 11 of the long-period type period table, such as platinum (Pt), nickel (Ni), tungsten (W), chromium (Cr), molybdenum (Mo), iron (Fe), cobalt (Co), copper (Cu), palladium (Pd) and the like, and chemical compounds of these elements, can be used as the anodic material employed in the first electrode 402 in this embodiment as a substitute for gold (Au) to form the first electrode 401 at a film thickness of an order so as to possesses light blocking characteristic.

The first organic compound layer 405 is formed next. Note that a laminate is formed in this embodiment by evaporating 30 nm of the hole injecting layer Cu-Pc, 40 nm of the hole transporting material α-NMD, 10 nm of the blocking material BCP, and 40 nm of the electron transporting material $Alq_3$.

The opposing electrode 404 is formed next as a cathode. A laminate is formed in this embodiment from 2 nm of cesium fluoride (CsF) containing cesium (Cs), which has a small work function, 50 nm of ITO, which is a light transmitting conductive film, and in addition, 2 nm of CsF. The opposing electrode 404 is formed in this embodiment by forming a laminate structure in which a material having a small work function is used in portions that contact the organic compound layers, and a conductive material having superior light transmitting characteristics is sandwiched therebetween. The opposing electrode 404, which possesses a plurality of functions, can thus be formed.

Note that a cathodic material is used as the material for forming the opposing electrode 404. It is not always necessary to form a laminate structure like that explained above, however, and a single layer structure may also be formed, provided that a conductive material having light transmitting characteristics is employed.

Further, barium fluoride ($BaF_2$), calcium fluoride (CaF), and the like can also be used as a substitute for cesium fluoride (CsF) when manufacturing the cathode.

The second organic compound layer 406 is formed next. Note that the second organic compound layer 406 is formed by evaporation using the same material as that used for the first organic compound layer 405 in this embodiment. However, the lamination order from the opposing electrode 404 side is the exact opposite to that of the first organic compound layer 405, which is laminated on the first electrode 402, because the lamination order depends on the relationship with the electrode. That is, the second organic compound layer 406 is formed by evaporating 40 nm of the electron transporting material $Alq_3$, 10 nm of the blocking material BCP, 40 nm of the hole transporting material α-NPD and 30 nm of the hole injecting layer Cu-Pc.

The second electrode 403 is formed lastly. Note that the second electrode 403 is an anode in this embodiment, and further, it is necessary to provide the second electrode 403 with function for transmitting light that develops in the organic compound layers (the first organic compound layer 405 and the second organic compound layer 406). The second electrode 403 is therefore formed by sputtering to a film thickness of 100 nm by using the light transmitting conductive ITO film. Note that the second electrode 403 is formed by sputtering after forming the second organic compound layer 406 in this embodiment. However, damage imparted during film formation by sputtering can be prevented because, unlike Embodiment 1, the film formation surface on which the second electrode 403 is formed is made of Cu-Pc.

Note that the first light emitting element 407 and the second light emitting element 408 are each structured by sharing the opposing electrode 404, which is a cathode.

Light emitting elements capable of emitting light, which develops in the organic compound layers (the first organic compound layer 405 and the second organic compound layer 406), with good efficiency only from the second electrode 403 side can thus be formed in this embodiment. Note that, in the case where the top emission light emitting element disclosed in this embodiment is used in an active matrix light emitting device in which a plurality of TFTs are formed, an aperture ratio reduction due to the TFTs does not cause a problem, and therefore it becomes possible to manufacture a light emitting device having a high aperture ration. Further, in the case where inverse polarity voltages are applied alternately, the first light emitting element 407 or the second light emitting element 408 can be made to emit light alternately, and charge accumulation that develops in an inner portion of the organic compound layer during light emission can also be relieved at the same time in the light emitting element to which a reverse bias is applied, and which does not emit light.

Embodiment 3

A passive (simple matrix) light emitting device having a light emitting element of the present invention is explained in this embodiment.

Figure 5A:
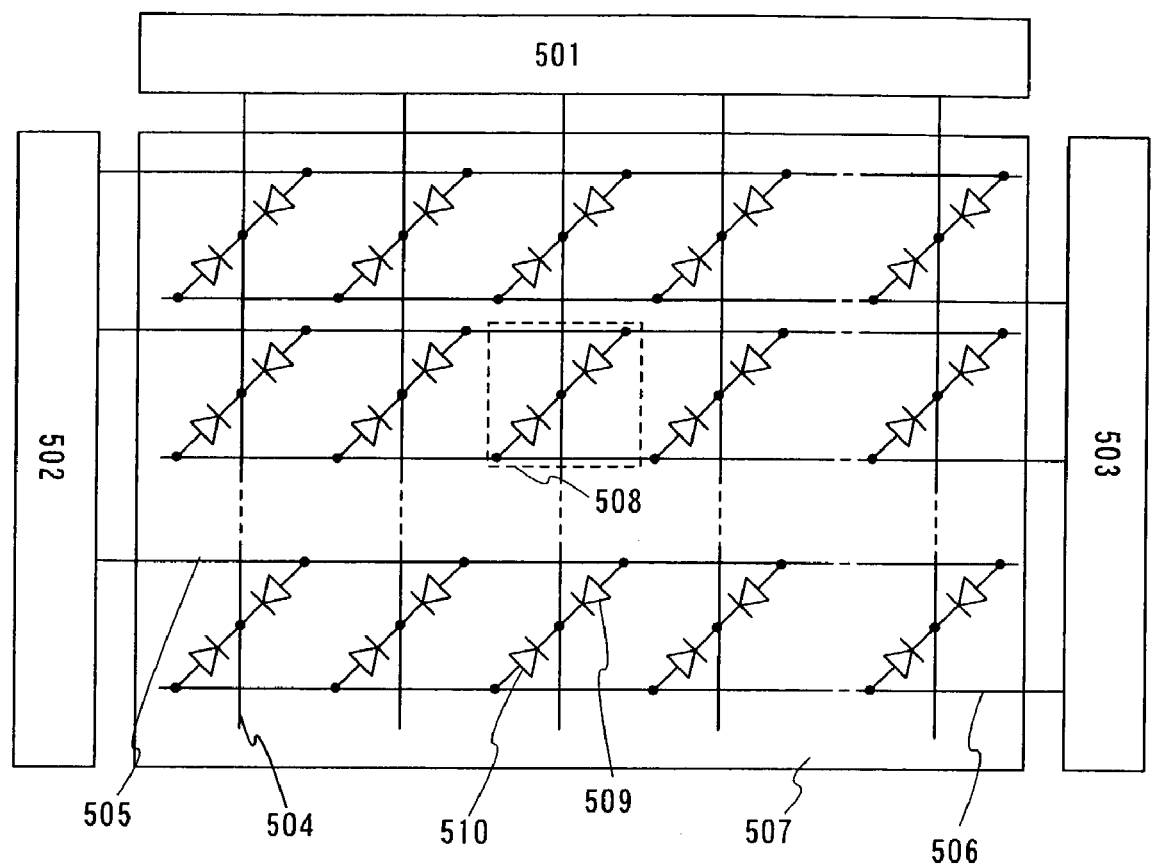
FIGS. 5A and 5B are diagrams for explaining about a passive matrix light emitting device.

The structure of a passive light emitting device is shown in FIG. 5A. Reference numeral 507 denotes a pixel portion, which has a plurality of pixels 508. Each of the pixels has one of a plurality of data lines 504, one of a plurality of scanning lines (A) 505, and one of a plurality of scanning lines (B) 506. A first organic compound layer is formed between the data lines 504 and the scanning lines (A) 505, and a second organic compound layer is formed between the data lines 504 and the scanning lines (B) 506. The data lines 504 and the scanning lines (A) 505, and the data lines 504 and the scanning lines (B) 506 become electrodes, forming first light emitting elements 509 and second light emitting elements 510. Note that the pixels 508 have one each of the first light emitting elements 509 and the second light emitting elements 510 connected to the same data line 504 in this embodiment.

Signals input to the data lines 504 are controlled by a data line driver circuit 501, signals input to the scanning lines (A) 505 are controlled by a scanning line driver circuit (A) 502, and signals input to the scanning lines (B) are controlled by a scanning line driver circuit (B) 503.

Figure 5B:
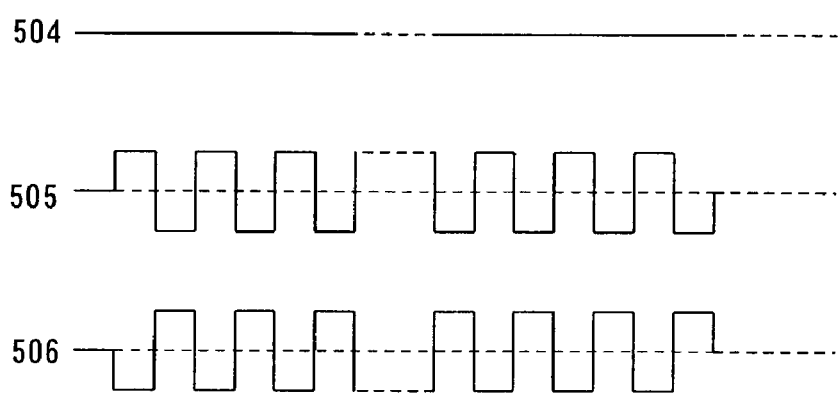

The voltage levels of signals input to the data lines 504, the scanning lines (A) 505, and the scanning lines (B) 506 when driving the light emitting elements of the present invention are shown in FIG. 5B. The voltage of each of the data lines 504 is constant (reference voltage). Voltages having positive polarity or negative polarity with respect to the reference voltage are input alternately to the scanning lines (A) 505 for fixed periods of time, and voltages having polarities that are the inverse of those input to the scanning lines (A) 505 are input alternately for the fixed periods of time to the scanning lines (B) 506.

Forward biases and reverse biases are thus applied alternately to the first organic compound layer that structures the first light emitting element 509 and to the second organic compound layer that structures the second light emitting element 510. This becomes a structure wherein a forward bias is applied to one light emitting element, either the first light emitting element 509 or the second light emitting element 510 formed in the pixel, while a reverse bias is applied to the other light emitting element. The accumulation of electric charge in inner portions of the organic compound layers of the light emitting elements, to which the forward bias is applied to cause light emission, can therefore be relieved by applying the reverse bias.

The first light emitting element 509 and the second light emitting element 510 can thus be made to alternately emit light by applying the forward bias alternately from the scanning line (A) 505 and the scanning line (B) 506. Further, the accumulations of electric current that develop in the inner portions of the organic compound layers of the first light emitting element 509 and the second light emitting element 510 during light emission can be relieved alternately by applying the reverse bias alternately.

Note that this embodiment can be implement in free combination with Embodiments 1 or 2.

Embodiment 4

An example of using the present invention in an active matrix light emitting device that has four thin film transistors (TFT) in each pixel is explained in this embodiment.

Figure 6:
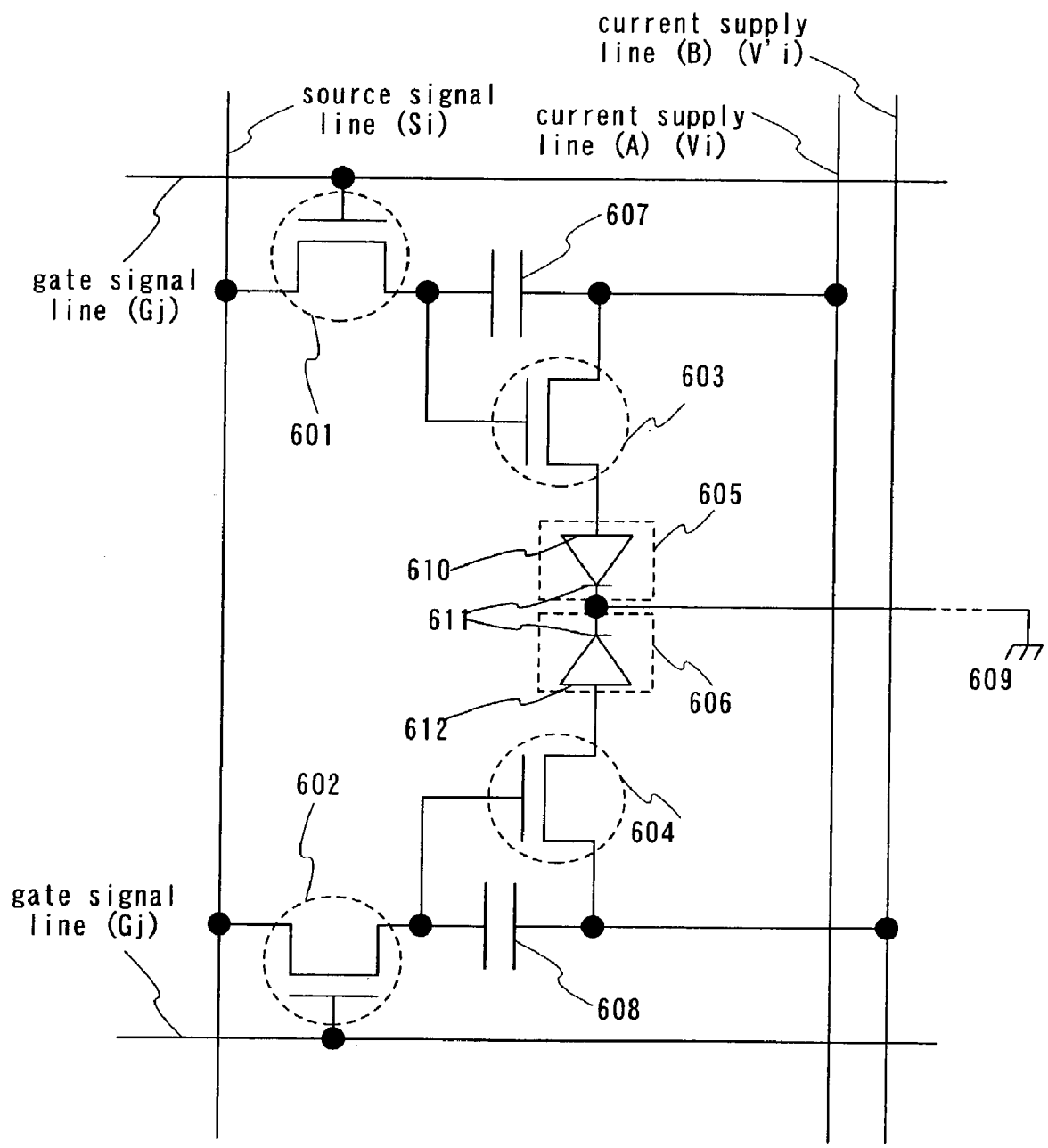
FIG. 6 is a diagram for explaining about an active matrix light emitting device.

A circuit diagram of a pixel in a light emitting device having a light emitting element of the present invention is shown in FIG. 6. Each pixel has a source signal line Si (where i is any one of 1 to x), a current supply line (A) Vi (where i is any one of 1 to x), an current supply line (B) V'i (where i is any one of 1 to x), and a gate signal line Gj (where j is any one of 1 to y).

Further, each pixel has a switching TFT (A) 601, a switching TFT (B) 602, a current control TFT (A) 603, a current control TFT (B) 604, a first light emitting element 605, a second light emitting element 606, a capacitor (A) 607, and a capacitor (B) 608.

Gate electrodes of the switching TFT (A) 601 and the switching TFT (B) 602 are both connected to the gate signal lines Gj. Further, regions of one type, either source regions or drain regions, of the switching TFT (A) 601 and the switching TFT (B) 602 are connected to the source signal line Si, and regions of the other type are connected to a gate electrode of the current control TFT (A) 603 for the case of the switching TFT (A) 601, and to a gate electrode of the current control TFT (B) 604 for the case of the switching TFT (B) 602, respectively.

A source region of the current control TFT (A) 603 is connected to the current supply line (A) Vi, and a drain region of the current control TFT (A) 603 is connected to one of two electrodes of the first light emitting element 605. Of the two electrodes of the first light emitting element 605, the one not connected to the drain region of the current control TFT (A) 603 is connected to an opposing electric power source 609.

Note that, of the two electrodes of the first light emitting element 605, the electrode that is connected to the drain region of the current control TFT (A) 603 is a first electrode 610, and the electrode that is connected to the opposing electric power source 609 is an opposing electrode 611.

A source region of the current control TFT (B) 604 is connected to the current supply line (B) V'i, and a drain region of the current control TFT (B) 604 is connected to one of two electrodes of the second light emitting element 606. Of the two electrodes of the second light emitting element 606, the one not connected to the drain region of the current control TFT (B) 604 is connected to the opposing electric power source 609.

Note that, of the two electrodes of the second light emitting element 606, the electrode that is connected to the drain region of the current control TFT (B) 604 is referred to as a second electrode 612, and the electrode that is connected to the opposing electric power source 609 is referred to as the opposing electrode 611. That is, the first light emitting element 605 and the second light emitting element 606 use the opposing electrode 611 as a shared electrode.

Further, the capacitor (A) 607 is formed between the gate electrode of the current control TFT (A) 603 and the current supply line (A) Vi, and the capacitor (B) 608 is formed between the gate electrode of the current control TFT (B) 604 and the current supply line (B) V'i.

Figure 7A:
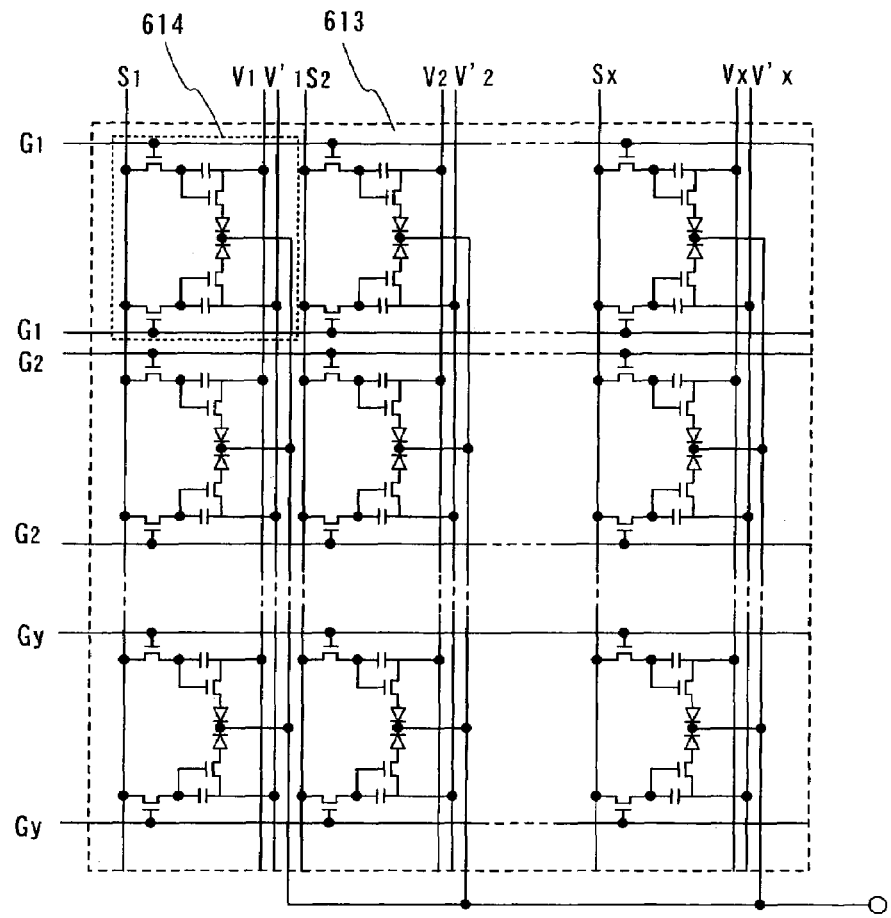
FIGS. 7A and 7B are diagrams for explaining about an active matrix light emitting device.

A pixel portion of a light emitting device having a plurality of the pixels of FIG. 6 is shown in FIG. 7A. The pixel portion 613 has source signal lines $S_1$ to Sx, current supply lines (A) $V_1$ to Vx, current supply lines (B) $V'_1$ to V'x, and gate signal lines $G_1$ to Gy. A plurality of pixels 614 are formed in a matrix shape in the pixel potion 613.

Figure 7B:
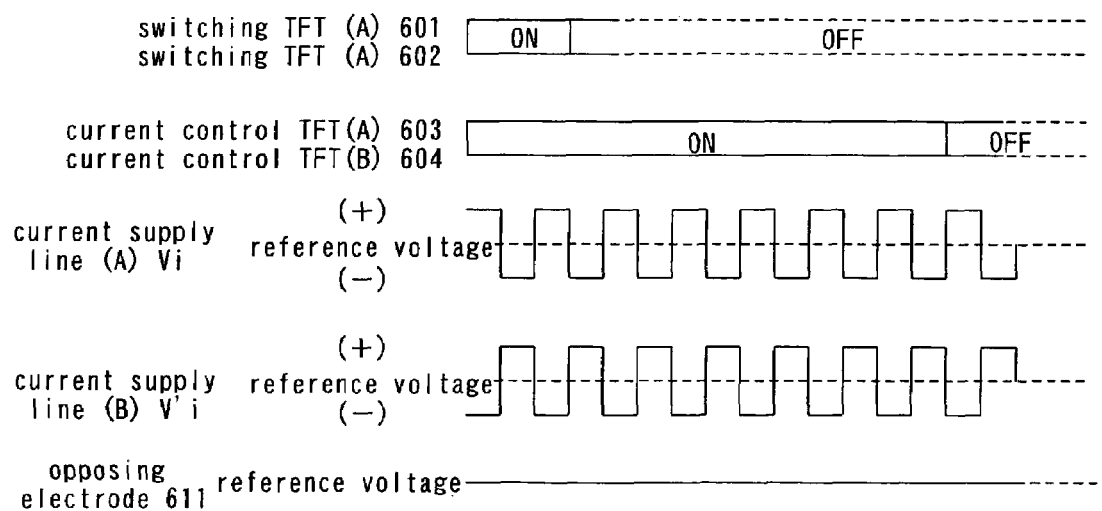

Operations of the TFTs in each pixel, and the voltage levels of signals input to the current supply line (A) Vi, the current supply line (B) V'i, and the opposing electrode 611 when driving the first light emitting element 605 and the second light emitting element 606 are shown in FIG. 7B. Note that a constant voltage (reference voltage) is always applied to the opposing electrode 611, and positive polarity voltages, which are high voltages with respect to the reference voltage, or negative polarity voltages, which are low voltages with respect to the reference voltage, are input to the current supply line (A) and the current supply line (B). Note also that the positive polarity voltages and the negative polarity voltages are controlled so as to be applied alternately for fixed periods of time. Further, the voltages applied to the current supply line (A) and the current supply line (B) have inverse polarities at the same timing.

If the switching TFT (A) 601 and the switching TFT (B) 602 of the pixel are simultaneously in an on state, and the current control TFT (A) 603 and the current control TFT (B) 604 are in an on state, then the voltage input to the current supply line (A) is applied to the first electrode 610 of the first light emitting element 605, and the voltage input to the current supply line (B) is applied to the second electrode 612 of the second light emitting element 606.

In the case where the first electrode 610 and the second electrode 612 are formed by using anodic materials, and the opposing electrode 611 is formed by using a cathodic material, a forward bias is applied to the light emitting element that has an electrode to which the positive polarity voltage is applied (the first electrode 610 or the second electrode 612), and therefore this light emitting element emits light. A reverse bias is applied to the light emitting element that has an electrode to which the negative polarity voltage is applied (the first electrode 610 or the second electrode 612), and therefore this light emitting element does not emit light.

Conversely, in the case where the first electrode 610 and the second electrode 612 are formed by using a cathodic material, and the opposing electrode 611 is formed by using an anodic material, a forward bias is applied to the light emitting element that has an electrode to which the negative polarity voltage is applied (the first electrode 610 or the second electrode 612), and therefore this light emitting element emits light. A reverse bias is applied to the light emitting element that has an electrode to which the positive polarity voltage is applied (the first electrode 610 or the second electrode 612), and therefore this light emitting element does not emit light.

The voltage applied to the opposing electrode 611 is set to 0 V in this embodiment, and the voltages applied to the first electrode and the second electrode from the current supply line (A) Vi and the current supply line (B) V'i are set to −5 V (the negative polarity voltage) and +5 V (the positive polarity voltage), respectively.

The forward bias and the reverse bias can thus be applied alternately from the electric current supply line (A) Vi and the electric current supply line (B) V'i. Note that the first light emitting element 605 and the second light emitting element 606 formed in the same pixel are structured so that when the forward bias is applied to one of the light emitting elements, the reverse bias is applied to the other light emitting element, and therefore, the light emitting elements to which the forward bias is applied are made to emit light alternately, and at the same time, the accumulation of electric charge in inner portions of the organic compound layers of the light emitting elements can be relieved by application of the reverse bias.

Note that this embodiment can be implemented by freely combining with the structure shown in Embodiments 1 or 2.

Embodiment 5

The structure of the active matrix light emitting device explained in Embodiment 4 is explained in Embodiment 5 using FIGS. 8A to 8D. Note that, of the TFTs structuring the pixel portion, only a current control TFT (A) 802 and a current control TFT (B) 803 are explained.

Figure 8A:
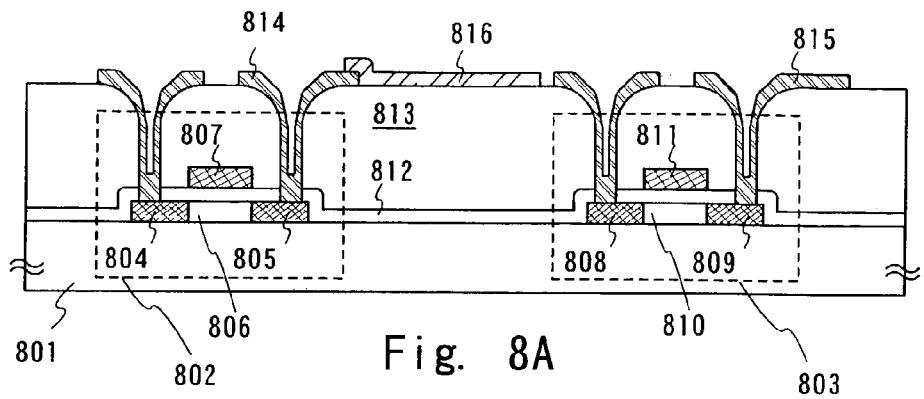
FIGS. 8A to 8D are diagrams for explaining about an active matrix light emitting device.

The current control TFT (A) 802 and the current control TFT (B) 803 are formed on a substrate 801 in FIG. 8A. Note that the current control TFT (A) 802 has an active layer that contains a source region 804, a drain region 805, and a channel region 806, and a gate electrode 807 that is disposed overlapping with the channel region 806 through a gate insulating film 812. Further, the source region 804 is electrically connected to a source side driver circuit (not shown) by a wiring (a) 814, and the drain region 805 is electrically connected to a first electrode 816 formed by the wiring (a) 814 through an interlayer insulating film 813.

The current control TFT (B) 803 also has the same structure as the current control TFT (A) 802, and has an active layer that contains a source region 808, a drain region 809, and a channel region 810 and a gate electrode 811. However, the source region 808 is electrically connected to a source side driver circuit (not shown) by a wiring (b) 815.

Note that it is preferable to form the current control TFT (A) 802 and the current control TFT (B) 803 by using p-channel TFTs in this embodiment because the first electrode 816 is formed by using an anodic material. Further, it is preferable to form the current control TFT (A) 802 and the current control TFT (B) 803 by n-channel TFTs if the first electrode is formed by using a cathodic material.

Note that the materials shown in the embodiment mode of the present invention can be used as the anodic material that forms the first electrode 816 in this embodiment. The first electrode 816 is formed by using ITO as the anodic material in this embodiment. Note that the first electrode 816 formed here is formed by sputtering ITO to have a thickness of 100 nm.

Figure 8B:
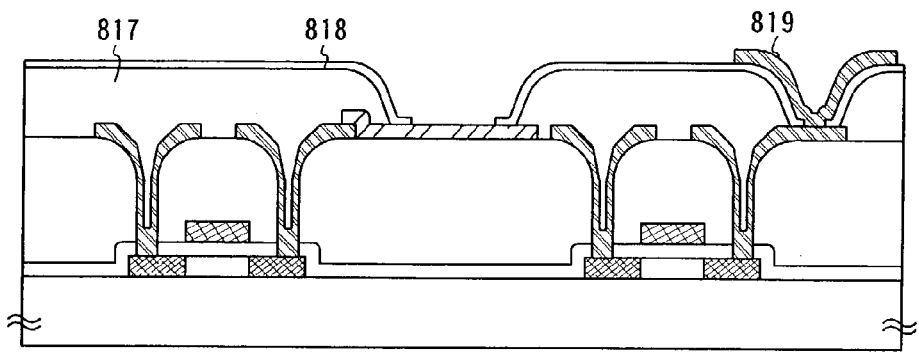
Figure 8C:
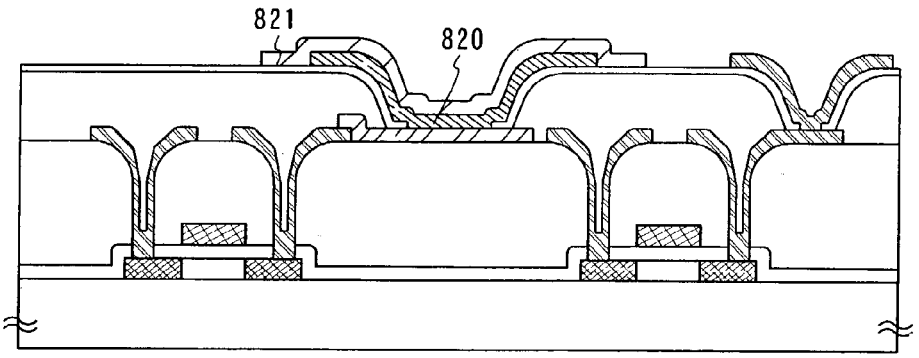
Figure 8D:
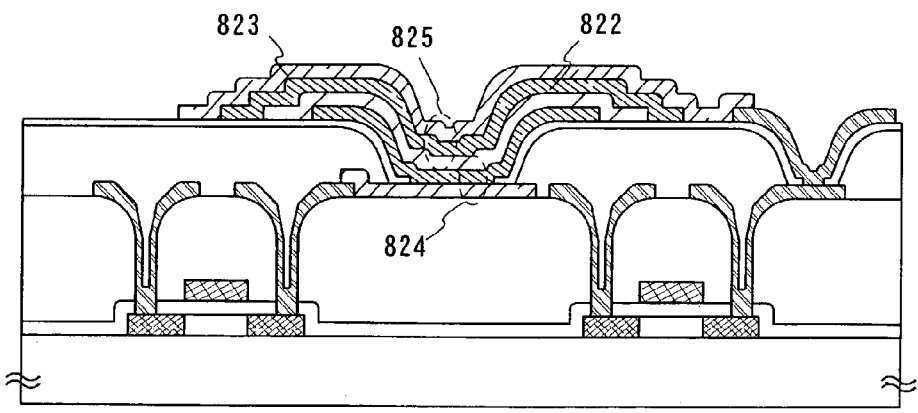

A first insulating film 817 made from an organic resin material is formed next on the wiring (a) 814, the wiring (b) 815, and the first electrode 816 as shown in FIG. 8B. The first insulating film 817 is formed by using a photosensitive resin material in this embodiment. Note that negative type or positive type materials can be used as the photosensitive resin material. The first insulating film 817 is formed to have a thickness of 1 to 2 μm by using a positive type photosensitive polyimide or photosensitive acrylic in this embodiment.

In addition, a second insulating film 818 made from an inorganic material is formed on the first insulating film 817 in this embodiment. Specifically, the second insulating film 818 is formed by using a silicon nitride film that is formed by sputtering. Note that the second insulating film 818 is patterned so that it is not formed on the first electrode 816 or the wiring (b) 815 except for a portion, as shown in FIG. 8B. Deterioration of the material used for forming the organic compound layers due to oxygen, moisture, and the like that is generated from the organic resin material used in forming the first insulating film 817 can be prevented by forming the second insulating film 818 using the silicon nitride film here.

An auxiliary wiring 819 is formed next contacting the wiring (b) 815. Note that the auxiliary wiring formed hear is formed in order to electrically connect the drain region 809 of the current control TFT (B) and a second electrode that is formed later.

A first organic compound layer 820 is formed next on the first electrode 816. The materials shown in the embodiment mode of the present invention can be used as the material that forms the first organic compound layer 820, and a laminate is formed in this embodiment by evaporating 40 nm of the hole transporting material α-NPD, 10 nm of the blocking material BCP, and 40 nm of the electron transporting material $Alq_3$.

An opposing electrode 821 is formed next on the first organic compound layer 820 so as to completely cover the first organic compound layer 820. The opposing electrode 821 is formed by using a cathodic material in this embodiment, specifically, by a laminate of 2 nm of cesium fluoride (CsF) that contains cesium (Cs), which has a small work function, 50 nm of ITO, which is a light transmitting conductive film, and in addition, 2 nm of CsF.

A second organic compound layer 822 is formed next on the opposing electrode 821 so as to completely cover the opposing electrode 821. Note that the same material as that used for the first organic compound layer 8920 is formed by evaporation in this embodiment. However, the lamination order from the opposing electrode 821 side is the exact opposite to that of the first organic compound layer 820, which is laminated on the first electrode 816, because the lamination order depends on the relationship with the electrode. That is, the laminate is formed by evaporating 40 nm of the electron transporting material $Alq_3$, 10 nm of the blocking material BCP, and 40 nm of the hole transporting material α-NPD.

Lastly, a second electrode 823 is formed on the second organic compound layer 822, completely covering the second organic compound layer 822, and contacting the auxiliary wiring 819 formed above. Note that the second electrode 823 is formed by using an anodic material. The second electrode 823 is provided with light blocking characteristics in this embodiment for the formation by forming it using the anodic material gold (Au) to have a thickness of 100 nm.

An active matrix light emitting device that has a first light emitting element 824 including the first electrode 816, the first organic compound layer 820, and the opposing electrode 821, and a second light emitting element 825 including the opposing electrode 821, the second organic compound layer 822, and the second electrode 823 can thus be produced. Note that the first light emitting element 824 and the second light emitting element 825 share the opposing electrode 821, which is a cathode, in the present invention, thus structuring the elements.

As described above, in this embodiment, light emitting elements capable of emitting light that is generated in the organic compound layers (the first organic compound layer 820 and the second organic compound layer 822) efficiently only from the first electrode 816 side can thus be formed. Note that the structure of the present invention is not limited by the structure shown in this embodiment. For example, the first electrode can also be formed by using an anodic material that has light blocking characteristics, and the second electrode 823 can also be formed by using a material that has light transmitting characteristics in the case where the first electrode 816 and the second electrode 823 are formed by anodic materials. Further, the first electrode 816 and the second electrode 823 can both be formed by using light transmitting anodic materials depending upon the circumstances.

Embodiment 6

Figure 9:
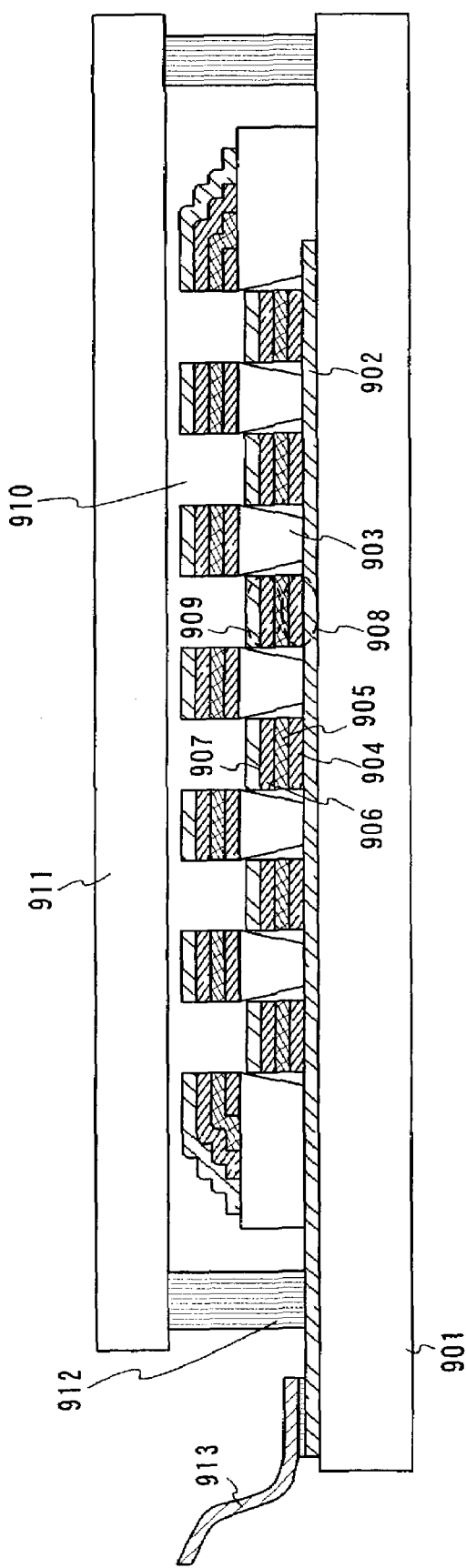
FIG. 9 is a diagram for explaining about a passive matrix light emitting device.

A case of manufacturing a passive (simple matrix) light emitting device having the element structure of the present invention is explained in this embodiment. FIG. 9 is used in the explanation. Reference numeral 901 denotes a glass substrate in FIG. 9, and reference numeral 902 denotes a first electrode that functions as an anode. Note that, after forming ITO by sputtering, the first electrode 902 is formed by patterning. Although not shown in FIG. 9, a plurality of first electrodes 902 are disposed in stripe shapes parallel to the page.

Further, banks 903 made from an insulating material are formed so as to intersect with the first electrodes 902 disposed in a stripe shape. The banks 903 are formed contacting the first electrode 902 in a direction orthogonal to the page.

First organic compound layers 904 are formed next. The first organic compound layers 904 are formed by laminating 40 nm of the hole transporting material α-NPD, 10 nm of the blocking material BCP, and 40 nm of the electron transporting material $Alq_3$ by using evaporation in this embodiment. Further, the first organic compound layers 904 are formed along grooves formed by the banks 903, and therefore, are disposed in a stripe shape in a direction orthogonal to the page.

Opposing electrodes 905 are formed next. The opposing electrodes 905 function as cathodes, and further, are formed by a light transmitting conductive material. The opposing electrodes 905 are formed by a laminate of 2 nm of cesium fluoride (CsF) containing cesium (Cs), which has a small work function, 50 nm of ITO, which is a light transmitting conductive film, and in addition, 2 nm of CsF. The opposing electrodes 905 can thus be formed to possess a plurality of functions by using a material having a small work function in portions that contact the organic compound layers, and further, by forming a laminate structure in which a conductive material having superior light transmitting characteristics is sandwiched therebetween.

Second organic compound layers 906 are formed next. Note that the second organic compound layers 906 are formed by evaporation using the same material as that used for the first organic compound layers 904 in this embodiment. However, the lamination order from the opposing electrode 905 side is the exact opposite to that of the first organic compound layers 904, which are laminated on the first electrodes 902, because the lamination order depends on the relationship with the electrodes. That is, the laminates are formed by evaporating 40 nm of the electron transporting material $Alq_3$, 10 nm of the blocking material BCP, and 40 nm of the hole transporting material α-NPD.

Lastly, second electrodes 907 are formed. It is necessary to provide function as anodes and function for blocking or reflecting light that is generated in the organic compound layers to the second electrodes, and therefore, the second electrodes 907 are provided with light blocking characteristics and formed to have a thickness of 100 nm by using the anodic material gold (Au).

A passive matrix light emitting device having first light emitting elements 908 including the first electrodes 902, the first organic compound layers 904, and the opposing electrodes 905, and second light emitting elements 909 including the opposing electrodes 905, the second organic compound layers 906, and the second electrodes 907 is thus formed.

Note that the first electrodes 902 are formed by using a light transmitting anodic material in the passive matrix light emitting device disclosed in this embodiment, and therefore, light that is generated in the first organic compound layers 904 or the second organic compound layers 906 is emitted to the lower side (the substrate 901 side).

A ceramic substrate is prepared next as a sealing substrate 911. Light blocking characteristics are fine with the structure of this embodiment, and therefore, the ceramic substrate is used, but a substrate made from plastic, glass, or quartz can also be used.

The sealing substrate 911 thus prepared is bonded by using a sealant 912 made from an ultraviolet setting resin. Note that an inside 910 of the sealant 912 becomes a sealed space, and an inert gas such as nitrogen or argon can be filled into the space. Furthermore, it is effective to provide a hygroscopic material, typically barium oxide, within the sealed space 910. Lastly, an FPC 913 is attached, thus completing the passive light emitting device. Note that the sealing structure shown in this embodiment can also be used for the active matrix light emitting devices shown in Embodiment 4 and Embodiment 5, not only for the passive matrix light emitting device shown in Embodiment 3.

Embodiment 7

The light-emitting device fabricated in accordance with the present invention is of the self-emission type, and thus exhibits more excellent recognizability of the displayed image in a light place as compared to the liquid crystal display device. Furthermore, the light-emitting device has a wider viewing angle. Accordingly, various electronic apparatuses can be completed by using the light-emitting device of the present invention to a display portion.

Such electronic apparatuses manufactured by the present invention include a video camera, a digital camera, a gogglestype display (head mount display), a navigation system, a sound reproduction device (a car audio equipment, an audio set and the like), a laptop personal computer, a game machine, a portable information terminal (a mobile computer, a cellular phone, a portable game machine, an electronic book, or the like), an image reproduction apparatus including a recording medium (more specifically, an apparatus which can reproduce a recording medium such as a digital versatile disc (DVD) and so forth, and includes a display for displaying the reproduced image), or the like. In particular, in the case of the portable information terminal, use of the light-emitting device with a light-emitting element is preferable, since the portable information terminal that is likely to be viewed from a tilted direction is often required to have a wide viewing angle. FIGS. 10A to 10H shows various specific examples of such electronic apparatus.

Figure 10A:
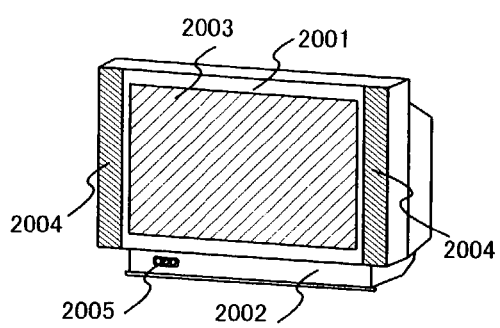
FIGS. 10A to 10H are diagrams for explaining about electric equipments.

FIG. 10A illustrates a display-device which includes a frame 2001, a support table 2002, a display portion 2003, a speaker portion 2004, a video input terminal 2005 or the like. The light-emitting device manufactured by the present invention can be used for the display portion 2003. The light-emitting device is of the self-emission type and therefore requires no backlight. Thus, the display portion thereof can have a thickness thinner than that of the liquid crystal display device. The display device is including all of the display devices for displaying information, such as a personal computer, a receiver of TV broadcasting and an advertising display.

Figure 10B:
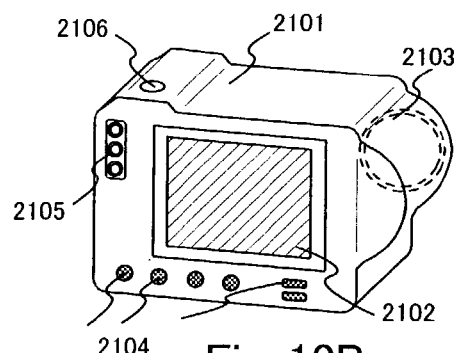

FIG. 10B illustrates a digital still camera which includes a main body 2101, a display portion 2102, an image receiving portion 2103, an operation key 2104, an external connection port 2105, a shutter 2106, or the like. The light-emitting device manufactured by the present invention can be used for the display portion 2102.

Figure 10C:
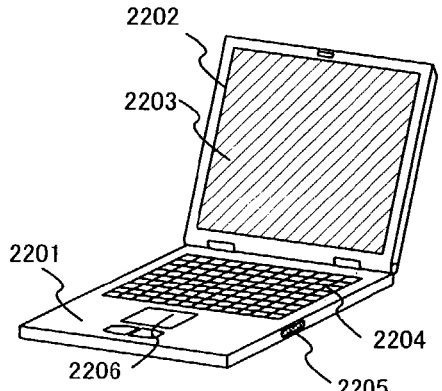

FIG. 10C illustrates a laptop type (notebook type) personal computer which includes a main body 2201, a casing 2202, a display portion 2203, a keyboard 2204, an external connection port 2205, a pointing mouse 2206, or the like. The light-emitting device manufactured by the present invention can be used to the display portion 2203.

Figure 10D:
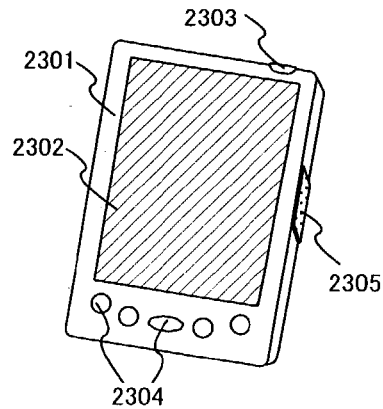

FIG. 10D illustrates a mobile computer which includes a main body 2301, a display portion 2302, a switch 2303, an operation key 2304, an infrared port 2305, or the like. The light-emitting device manufactured by the present invention can be used to the display portion 2302.

Figure 10E:
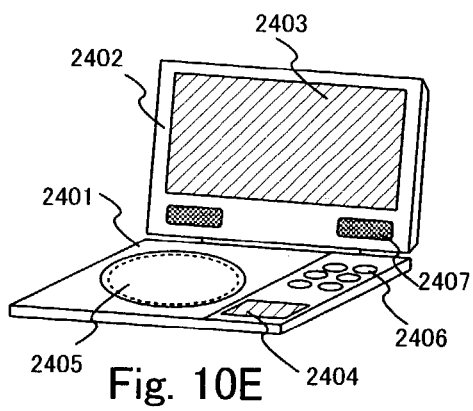

FIG. 10E illustrates an image reproduction apparatus including a recording medium (more specifically, a DVD reproduction apparatus), which includes a main body 2401, a casing 2402, a display portion A 2403, another display portion B 2404, a recording medium (DVD or the like) reading portion 2405, an operation key 2406, a speaker portion 2407 or the like. The display portion A 2403 is used mainly for displaying image information, while the display portion B 2404 is used mainly for displaying character information. The light-emitting device manufactured by the present invention can be used to the display potion A 2403 and the display portion B 2404. Note that the image reproduction apparatus including a recording medium further includes a domestic game machine or the like.

Figure 10F:
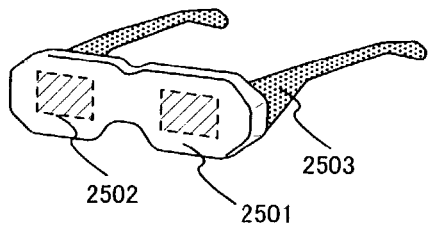

FIG. 10F illustrates a goggle type display (head mounted display) which includes a main body 2501, a display portion 2502, an arm portion 2503. The light-emitting device manufactured by the present invention can be used to the display portion 2502.

Figure 10G:
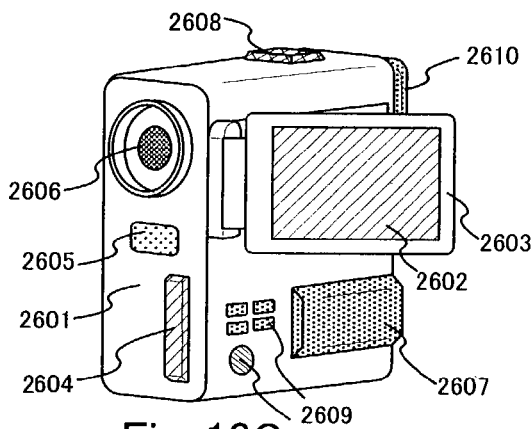

FIG. 10G illustrates a video camera which includes a main body 2601, a display portion 2602, an casing 2603, an external connecting port 2604, a remote control receiving portion 2605, an image receiving portion 2606, a battery 2607, a sound input portion 2608, an operation key 2609, an eyepiece potion 2610 or the like. The light-emitting device manufactured by the present invention can be used to the display portion 2602.

Figure 10H:
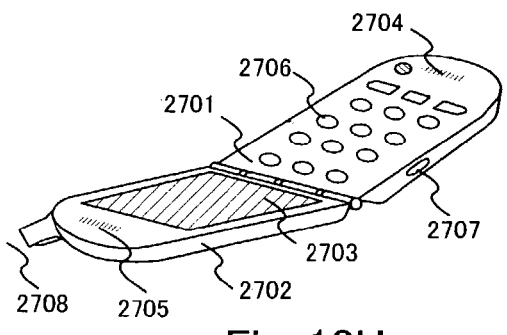

FIG. 10H illustrates a cellular phone which includes a main body 2701, a casing 2702, a display portion 2703, a sound input portion 2704, a sound output portion 2705, an operation key 2706, an external connecting port 2707, an antenna 2708, or the like. The light-emitting device manufactured by the present invention can be used to the display portion 2703. Note that the display portion 2703 can reduce power consumption of the cellular phone by displaying white-colored characters on a black-colored background.

When the brighter luminance of the organic material becomes available in the future, the light-emitting device manufactured by the present invention will be applicable to a front-type or rear-type projector in which light including output image information is enlarged by means of lenses or the like to be projected.

The aforementioned electronic apparatuses are more likely to be used for display information distributed through a telecommunication path such as Internet, a CATV (cable television system), and in particular likely to display moving image information. The light-emitting device is suitable for displaying moving images since the organic material can exhibit a high response speed.

A portion of the light-emitting device that is emitting light consumes power, so it is desirable to display information in such a manner that the light-emitting portion therein becomes as small as possible. Accordingly, when the light-emitting device is applied to a display portion which mainly displays character information, e.g., a display portion of a portable information terminal, and more particular, a cellular phone or a sound reproduction device, it is desirable to drive the light-emitting device so that the character information is formed by a light-emitting portion while a non-emission portion corresponds to the background.

As set forth above, the light-emitting device formed by using the present invention can be applied variously to a wide range of electronic apparatuses in all fields. The electronic apparatuses in this embodiment can be completed by using a light-emitting device shown in Embodiments 1 through 6 to the display portion.

By implementing the present invention, voltages having different polarities can be applied alternately for fixed periods of time to a first light emitting element and a second light emitting element, and therefore, light can be emitted alternately from one of the first light emitting element and the second light emitting element, to which a forward bias is applied. Further, while one of the light emitting elements is emitting light, a reverse bias is applied to the other light emitting element, and therefore, the accumulation of electric charge in an inner portion of an organic compound layer forming the light emitting element can be relieved. Reductions in the light emitting lifetime and degradation in brightness can thus be suppressed. In addition, even if voltages having different polarities are applied alternately to the light emitting elements of the present invention, the light emitting element to which a forward bias is applied will emit light, and therefore, it becomes possible to perform display without an effective shortening of the light emission time. Consequently, problems of the display becoming dark, and problems of organic compound layer deterioration that occurs by applying a high voltage so as to maintain a predetermined brightness can be solved.

What is claimed is:

1. A light emitting device comprising:
   a first electrode;
   a first chemical compound layer containing a first organic substance;
   an opposing electrode;
   a second chemical compound layer containing a second organic substance; and
   a second electrode,
   wherein the first chemical compound layer is disposed between the first electrode and the opposing electrode, and the second chemical compound layer is disposed between the opposing electrode and the second electrode;
   wherein a fixed voltage is applied to the opposing electrode; and
   wherein one of the first chemical compound layer and the second chemical compound layer emits light alternately for fixed periods by applying a voltage having one of a positive polarity and a negative polarity taking the fixed voltage as a reference alternately for the fixed periods to the first electrode and simultaneously applying a voltage which is inverse in polarity to the voltage applied to the first electrode taking the fixed voltage as a reference to the second electrode.

2. A light emitting device according to claim 1, wherein one of the first electrode and the second electrode is formed by using a light transmitting conductive material.

3. A light emitting device according to claim 1, wherein the opposing electrode has a structure in which films made from a plurality of materials are laminated.

4. A light emitting device according to claim 1, wherein the opposing electrode has a laminate structure in which a light transmitting conductive film is sandwiched between films made from a material having a work function which is equal to or less than 3.8 eV.

5. A light emitting device according to claim 1, wherein the light emitting device composes one selected from the group consisting of a digital still camera, a laptop type personal computer, a DVD reproduction apparatus, a goggle type display and a cellular phone.

6. A light emitting device comprising:
a first electrode;
a first chemical compound layer containing a first organic substance;
an opposing electrode;
a second chemical compound layer containing a second organic substance; and
a second electrode,
wherein the first chemical compound layer is disposed between the first electrode and the opposing electrode, and the second chemical compound layer is disposed between the opposing electrode and the second electrode;
wherein a fixed voltage is applied to the opposing electrode; and
wherein by applying a voltage having one of a positive polarity and a negative polarity taking the fixed voltage as a reference alternately for fixed periods to the first electrode and simultaneously applying a voltage which is inverse in polarity to the voltage applied to the first electrode taking the fixed voltage as a reference to the second electrode,
a forward bias is applied to one of the first chemical compound layer and the second chemical compound layer, and simultaneously a reverse bias is applied to the other one of the first chemical compound layer and the second chemical compound layer; and
polarities of the biases applied to the first chemical compound layer and the second chemical compound layer are changed alternately for the fixed periods.

7. A light emitting device according to claim 6, wherein one of the first electrode and the second electrode is formed by using a light transmitting conductive material.

8. A light emitting device according to claim 6, wherein the opposing electrode has a structure in which films made from a plurality of materials are laminated.

9. A light emitting device according to claim 6, wherein the opposing electrode has a laminate structure in which a light transmitting conductive film is sandwiched between films made from a material having a work function which is equal to or less than 3.8 eV.

10. A light emitting device according to claim 6, wherein the light emitting device composes one selected from the group consisting of a digital still camera, a laptop type personal computer, a DVD reproduction apparatus, a goggle type display and a cellular phone.

11. A light emitting device comprising:
a first anode electrode;
a first chemical compound layer containing a first organic substance;
a cathode electrode;
a second chemical compound layer containing a second organic substance; and
a second anode electrode,
wherein the first chemical compound layer is disposed between the first anode electrode and the cathode electrode, and the second chemical compound layer is disposed between the cathode electrode and the second anode electrode;
wherein the first anode electrode and the second anode electrode are formed by an anodic material and the cathode electrode is formed by a cathodic material;
wherein a fixed voltage is applied to the cathode electrode; and
wherein the first chemical compound layer emits light by applying a voltage having a positive polarity taking the fixed voltage as a reference to the first anode electrode, and electric charge accumulated in the second chemical compound layer is simultaneously relieved by applying a voltage having a negative polarity taking the fixed voltage as a reference to the second anode electrode.

12. A light emitting device according to claim 11, wherein one of the first anode electrode and the second anode electrode is formed by using a light transmitting conductive material.

13. A light emitting device according to claim 11, wherein the cathode electrode has a structure in which films made from a plurality of materials are laminated.

14. A light emitting device according to claim 11, wherein the cathode electrode has a laminate structure in which a light transmitting conductive film is sandwiched between films made from a material having a work function which is equal to or less than 3.8 eV.

15. A light emitting device according to claim 11, wherein the light emitting device composes one selected from the group consisting of a digital still camera, a laptop type personal computer, a DVD reproduction apparatus, a goggle type display and a cellular phone.

16. A light emitting device comprising:
a first electrode;
a first chemical compound layer containing a first organic substance;
an opposing electrode;
a second chemical compound layer containing a second organic substance; and
a second electrode,
wherein the first chemical compound layer is disposed between the first electrode and the electrode, and the second chemical compound layer is disposed between the electrode and the second electrode;
wherein the first electrode and the second electrode are formed by an anodic material and the opposing electrode is formed by a cathodic material;
wherein a fixed voltage is applied to the opposing electrode;
wherein by applying a voltage having one of the positive polarity and the negative polarity taking the voltage applied to the opposing electrode as a reference alternately for fixed periods to the first electrode, and simultaneously applying a voltage, which is inverse in polarity to the voltage applied to the first electrode taking the voltage applied to the opposing electrode as a reference, alternately for the fixed periods to the second electrode;
the first chemical compound layer emits light during applying the positive polarity voltage to the first electrode; and the second chemical compound layer emits light during applying the positive polarity voltage to the second electrode.

17. A light emitting device according to claim 16, wherein one of the first electrode and the second electrode is formed by using a light transmitting conductive material.

18. A light emitting device according to claim 16, wherein the opposing electrode has a structure in which films made from a plurality of materials are laminated.

19. A light emitting device according to claim 16, wherein the opposing electrode has a laminate structure in which a light transmitting conductive film is sandwiched between films made from a material having a work function which is equal to or less than 3.8 eV.

20. A light emitting device according to claim 16, wherein the light emitting device composes one selected from the group consisting of a digital still camera, a laptop type personal computer, a DVD reproduction apparatus, a goggle type display and a cellular phone.

21. A light emitting device comprising:
- a first anode electrode;
- a first chemical compound layer containing a first organic substance;
- a cathode electrode;
- a second chemical compound layer containing a second organic substance; and
- a second anode electrode,
- wherein the first chemical compound layer is disposed between the first anode electrode and the cathode electrode, and the second chemical compound layer is disposed between the cathode electrode and the second anode electrode;
- wherein a fixed voltage is applied to the cathode electrode;
- wherein a voltage having one of a positive polarity and a negative polarity taking the fixed voltage as a reference is alternately for fixed periods applied to the first anode electrode and simultaneously a voltage which is inverse in polarity to the voltage applied to the first anode electrode taking the fixed voltage as a reference is applied to the second anode electrode,
- wherein the first chemical compound layer emits light by applying a voltage having the positive polarity taking the fixed voltage as a reference to the first anode electrode, and electric charge accumulated in the second chemical compound layer is simultaneously relieved by applying a voltage having the negative polarity taking the fixed voltage as a reference to the second anode electrode.

22. A light emitting device according to claim 21, wherein one of the first anode electrode and the second anode electrode is formed by using a light transmitting conductive material.

23. A light emitting device according to claim 21, wherein the cathode electrode has a structure in which films made from a plurality of materials are laminated.

24. A light emitting device according to claim 21, wherein the cathode electrode has a laminate structure in which a light transmitting conductive film is sandwiched between films made from a material having a work function which is equal to or less than 3.8 eV.

25. A light emitting device according to claim 21, wherein the light emitting device composes one selected from the group consisting of a digital still camera, a laptop type personal computer, a DVD reproduction apparatus, a goggle type display and a cellular phone.

* * * * *